United States Patent [19]
Keeth et al.

[11] Patent Number: 6,167,495
[45] Date of Patent: Dec. 26, 2000

[54] METHOD AND APPARATUS FOR DETECTING AN INITIALIZATION SIGNAL AND A COMMAND PACKET ERROR IN PACKETIZED DYNAMIC RANDOM ACCESS MEMORIES

[75] Inventors: Brent Keeth, Boise; Troy A. Manning, Meridian, both of Id.

[73] Assignee: Micron Technology, Inc., Boise, Id.

[21] Appl. No.: 09/141,467

[22] Filed: Aug. 27, 1998

[51] Int. Cl.$^7$ ..................................... G06F 12/16
[52] U.S. Cl. ................ 711/167; 711/105; 711/167; 714/811; 714/812; 714/815; 714/819; 714/821; 714/764; 714/805
[58] Field of Search .................. 711/105, 167; 714/811, 812, 815, 819, 821, 764, 805

[56] References Cited

U.S. PATENT DOCUMENTS

| | | | |
|---|---|---|---|
| 4,164,787 | 8/1979 | Aranguren | 364/200 |
| 5,276,856 | 1/1994 | Norsworthy et al. | 713/500 |
| 5,615,223 | 3/1997 | Carr | 714/818 |
| 5,835,957 | 11/1998 | Lin | 711/169 |
| 5,862,337 | 1/1999 | Gray | 395/200.54 |
| 5,920,897 | 7/1999 | Jin et al. | 711/167 |
| 5,928,372 | 7/1999 | Yoshida | 714/704 |
| 5,966,731 | 10/1999 | Barth et al. | 711/167 |

OTHER PUBLICATIONS

Anonymous, "400MHz SLDRAM, 4M×16 SLDRAM Pipelined, Eight Bank, 2.5 V Operation," SLDRAM Consortium Advance Sheet, published throughout the United States, pp. 1–22.

Anonymous, "Draft Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

*Primary Examiner*—John W. Cabeca
*Assistant Examiner*—Christian P. Chace
*Attorney, Agent, or Firm*—Dorsey & Whitney LLP

[57] ABSTRACT

A system for detecting an initialization flag signal and distinguishing it from a normal flag signal having half the duration of the initialization flag signal. The initialization flag detection system may be included in the command buffer of a packetized DRAM that is used in a computer system. In one embodiment, the initialization flag detection system includes a pair of shift registers receiving the flag signal at their respective data inputs. One of the shift registers is clocked by a signal corresponding to an externally applied to command clock signal, while the other shift register is clocked by a quadrature clock signal. Together, the shift registers store a number of samples taken over a duration that is longer than the duration of the normal flag signal. The outputs of the shift registers are applied to a logic circuit, such as a NAND gate, that generates an initialization signal when all of the samples stored in the shift registers correspond to the logic levels of the flag signal. In another embodiment, the initialization flag detection system includes a plurality of latches receiving the flag signals at their data inputs. The latches are clocked by respective strobe signals corresponding to the command clock signal, but having phases that differ from each other. The outputs of the latches are applied to a logic circuit, such as a NAND) gate. Finally, in another embodiment of the invention, the bits of the command packet are sampled along with the flag signal and compared to the samples of the flag signal to detect when a command packet having a predetermined pattern does not correspond to a flag signal having a predetermined pattern.

71 Claims, 16 Drawing Sheets

METHOD AND APPARATUS FOR DETECTING AN INITIALIZATION SIGNAL AND A COMMAND PACKET ERROR IN PACKETIZED DYNAMIC RANDOM ACCESS MEMORIES

TECHNICAL FIELD

The present invention relates to packetized dynamic random access memory devices, and more particularly, to a method in apparatus for detecting a signal indicating the start of an initialization procedure that adjusts the timing of an internal clock signal used to strobe the initialization signal and a command packet.

BACKGROUND OF THE INVENTION

Conventional computer systems include a processor (not shown) coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium II® microprocessors are currently available that operate at clock speeds of at least 400 MHz. However, the remaining components of the computer system, with the exception of SRAM cache memory, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, bus bridge or similar device, and the input devices, output devices, and data storage devices are coupled to the processor bus through a bus bridge. The memory controller allows the system memory devices to operate at a clock frequency that is substantially lower than the clock frequency of the processor. Similarly, the bus bridge allows the input devices, output devices, and data storage devices to operate at a frequency that is substantially lower than the clock frequency of the processor. Currently, for example, a processor having a 200 MHz clock frequency may be mounted on a mother board having a 66 MHz clock frequency for controlling the system memory devices and other components.

Access to system memory is a frequent operation for the processor. The time required for the processor, operating, for example, at 200 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs, which did not require that an address be provided to the DRAM for each memory access.

More recently, synchronous dynamic random access memories ("SDRAMs") have been developed to allow the pipelined transfer of data at the clock speed of the motherboard. However, even SDRAMs are typically incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as "SyncLink." In the SyncLink architecture, the system memory may be coupled to the processor, either directly through the processor bus or through a memory controller. Rather than requiring that separate address and control signals be provided to the system memory SyncLink memory devices receive command packets that include both control and address information. The SyncLink memory device then outputs or receives data on a data bus that may be coupled directly to the data bus portion of the processor bus.

An example of a computer system 10 using the SyncLink architecture is shown in FIG. 1. The computer system 10 includes a processor 12 having a processor bus 14 coupled to three packetized dynamic random access memory or SyncLink DRAM ("SLDRAM") devices 16a–c through a memory controller 18. The computer system 10 also includes one or more input devices 20, such as a keypad or a mouse, coupled to the processor 12 through the processor bus 14, a bus bridge 22, and an expansion bus 24, such as an Industry Standard Architecture ("ISA") bus or a Peripheral Component Interconnect ("PCI") bus. The input devices 20 allow an operator or an electronic device to input data to the computer system 10. One or more output devices 30 are coupled to the processor 12 to display or otherwise output data generated by the processor 12. The output devices 30 are coupled to the processor 12 through the expansion bus 24, bus bridge 22 and processor bus 14. Examples of output devices 24 include printers and a video display units. One or more data storage devices 38 are coupled to the processor 12 through the processor bus 14, bus bridge 22, and expansion bus 24 to store data in or retrieve data from storage media (not shown). Examples of storage devices 38 and storage media include fixed disk drives floppy disk drives, tape cassettes and compact-disk read-only memory drives.

In operation, the processor 12 communicates with the memory devices 16a–c via the memory controller 18. The memory controller 18 sends the memory devices 16a–c command packets that contain both control and address information. Data is coupled between the processor 12 and the memory devices 16a–c through the memory controller 18 and the processor bus 14. Although all the memory devices 16a–c are coupled to the same conductors of the memory controller 18, only one memory device 16a–c at a time reads or writes data, thus avoiding bus contention. Bus contention is avoided by each of the memory devices 16a–c having a unique identifier, and the command packet containing an identifying code that selects only one of these components.

The computer system 10 also includes a number of other components and signal lines that have been omitted from FIG. 1 in the interests of brevity. For example as explained below the memory devices 16a–c also receive a command clock signal to provide internal timing signals, a data clock signal clocking data into the memory device 16, and a FLAG signal signifying the start of a command packet.

One of the memory devices 16a is shown in block diagram form in FIG. 2. The memory device 16a includes a clock generator circuit 40 that receives a command clock signal CMDCLK and generates an internal clock signal ICLK and a large number of other clock and timing signals to control the timing of various operations in the memory device 16. The memory device 16 also includes a command buffer 46 and an address capture circuit 48, which receive the internal clock signal ICLK, a command packet CA0–CA9 on a 10-bit command bus 50, and a FLAG signal on line 52. The memory controller (not shown) or other device normally transmits the command packet CA0–CA9 to the memory device 16a in synchronism with the command clock signal CMDCLK. As explained above, the command packet, which generally includes four 10-bit packet words, contains control and address information for each memory transfer. The FLAG signal identifies the start of a command packet, and it also signals the start of an initialization sequence, as described in greater detail below. The command buffer 46 receives the command packet from the bus 50, and compares at least a portion of the command packet to identifying data from an ID register 56 to determine if the command packet is directed to the memory device 16a or some other memory device 16b, c. If the command buffer 46 determines that the command packet is directed to the memory device 16a, it then provides the command words to a command decoder and sequencer 60. The command decoder and sequencer 60 generates a large number of internal control signals to control the operation of the memory device 16a during a memory transfer.

The address capture circuit 48 also receives the command words from the command bus 50 and outputs a 20-bit address corresponding to the address information in the command packet. The address is provided to an address sequencer 64, which generates a corresponding 3-bit bank address on bus 66, a 10-bit row address on bus 68, and a 7-bit column address on bus 70. The column address and row address are processed by column and row address paths 73, 75 as will be described below.

One of the problems of conventional DRAMs is their relatively low speed resulting from the time required to precharge and equilibrate circuitry in the DRAM array. The packetized DRAM 16a shown in FIG. 2 largely avoids this problem by using a plurality of memory banks 80, in this case eight memory banks 80a–h. After a memory read from one bank 80a, the bank 80a can be precharged while the remaining banks 80b–h are being accessed. Each of the memory banks 80a–h receive a row address from a respective row latch/decoder/driver 82a–h. All of the row latch/decoder/drivers 82a–h receive the same row address from a predecoder 84 which, in turn, receives a row address from either a row address register 86, redundant row circuit 87, or a refresh counter 88, as determined by a multiplexer 90. However, only one of the row latch/decoder/drivers 82a–h is active at any one time, as determined by bank control logic 94 as a function of a bank address from a bank address register 96.

The column address on bus 70 is applied to a column latch/decoder 100, which supplies I/O gating signals to an I/O gating circuit 102. The I/O gating circuit 102 interfaces with columns of the memory banks 80a–h through sense amplifiers 104. Data is coupled to or from the memory banks 80a–h through the sense amplifiers 104 and the I/O gating circuit 102 and a data path subsystem 108, which includes a read data path 110 and a write data path 112. The read data path 110 includes a read latch 120 that stores data from the I/O gating circuit 102. In the memory device 16a shown in FIG. 2, 64 bits of data are stored in the read latch 120. The read latch then provides four 16-bit data words to an output multiplexer 122 that sequentially supplies each of the 16-bit data words to a read FIFO buffer 124. Successive 16-bit data words are clocked into the read FIFO buffer 124 by a clock signal RCLK generated by the clock generator 40. The 16-bit words are then clocked out of the read FIFO buffer 124 by a clock signal obtained by coupling the RCLK signal through a programmable delay circuit 126. The read FIFO buffer 124 sequentially applies the 16-bit words to a driver circuit 128 in synchronism with the delayed RCLK signal. The driver circuit, in turn, applies the 16-bit data words to a data bus 130. The driver circuit 128 also applies the delayed RCLK signal to a clock line 132 as the DCLK signal. The programmable delay circuit 126 is programmed during initialization of the memory device so that the read data as received by the controller (not shown) processor, or other device has the optimum phase relative to DCLK signal at the controller, processor or other device for the DCLK signal to clock the read data into the memory controller (not shown), processor, or other device.

The write data path 112 includes a receiver buffer 140 coupled to the data bus 130. The receiver buffer 140 sequentially applies 16-bit words from the data bus 130 to four input registers 142, each of which is selectively enabled by a signal from a clock generator circuit 144. The clock generator circuit generates these enable signals responsive to the data clock DCLK, which for write operations, is applied to the memory device 16a on line 132 from the memory controller, processor, or other device. As with the command clock signal CMDCLK and command packet CA0–CA9, the memory controller or other device (not shown) normally transmits the data to the memory device 16a in synchronism with the data clock signal DCLK. The clock generator 144 is programmed during initialization to adjust the timing of the clock signal applied to the input register 142 relative to the DCLK signal so that the input registers can capture the write data at the proper times. Thus, the input registers 142 sequentially store four 16-bit data words and combine them into one 64-bit data word applied to a write FIFO buffer 148. The data are clocked into the write FIFO buffer 148 by a clock signal from the clock generator 144, and the data are clocked out of the write FIFO buffer 148 by an internal write clock WCLK signal. The WCLK signal is generated by the clock generator 40. The 64-bit write data are applied to a write latch and driver 150. The write latch and driver 150 applies the 64-bit write data to one of the memory banks 80a–h through the I/O gating circuit 102 and the sense amplifiers 104.

Portions of the command buffer 46 is illustrated in greater detail in FIG. 3. With reference to FIG. 3, a command packet CA consisting of a plurality of packet words is applied to a shift register 202 via the command bus 50. The width of the bus 204 corresponds to the width of the shift register 202, and the number of packet words in the command packet corresponds to the number of stages of the shift register 202. In the embodiment shown in FIG. 3, the shift register 202 has four stages, each of which is 10 bits wide. Thus, the shift register 202 sequentially receives four 10-bit packet words CA<0:9>. Each of the four packet words is shifted into the shift register 202, and from one shift register stage to the next, responsive to each transition of the internal clock signal ICLK.

Coincident with the start of each command packet during normal operation of the memory device 16a, the FLAG signal transitions high for one-half of the period of the internal clock signal ICLK. The flag signal FLAG, which is coupled to the memory device 16a via the flag line 52, is also applied to the shift register 202. In normal operation, the high FLAG signal is shifted through each of the four stages of the shift register 202 responsive to each transition of the ICLK signal. As a result, the F<0> bit of the shift register 202 transitions high on the transition of the ICLK signal following the FLAG signal transitioning high. On the next transition of the ICLK signal, the F<0> bit transitions low and the F<1>bit transitions high, on the next transition of the ICLK signal the F<1>bit transitions low and the F<2>bit transitions high, etc. Thus, in normal operation, only one F<3:0> bit is high at a time.

When four packet words have been shifted into the shift register 202, an F<3>signal is generated at the output of the shift register 202. The F<3>signal then loads the 40 bit contents of the shift register 202 into a storage register 208. In the embodiment shown in FIG. 3 in which four 10-bit packet words are shifted into the shift register 202, the storage register 208 receives and stores a 40-bit command word in addition to shifting the FLAG signal through the shift register 202. However, in the more general case, the shift register 202 has N+1 stages, each of which has a width of M bits, and the storage register 208 loads an M*N bit command word. After the storage register 208 has been loaded, it continuously outputs the M*N bit command word Y<39:0>.

As further shown in FIG. 3, the internal clock signal ICLK is generated from the command clock signal CMDCLK by the clock generator 40. The phase of the internal clock signal ICLK relative to the phase of the command clock signal CMDCLK controlled by and the phases of the DCLK and WCLK signals are controlled by respective values of PHASE bits, which are generated by a logic circuit (not shown in FIG. 3). The values of PHASE are determined during initialization, as described above and, in greater detail in U.S. patent application Ser. No. 08/890,055 to Baker et al., which is incorporated herein by reference.

It will be understood that necessary portions of the command buffer and clock generator circuit 200 have been omitted from FIG. 3 in the interests of brevity since they are somewhat peripheral to the claimed invention. For example, the command buffer 48 will contain circuitry for allowing the command buffer to determine if a command packet is directed to it, circuitry for pipelining command words output from the storage register 208, circuitry for generating lower level command signals from the command word, etc.

The relevant portions of the clock generator circuit 40 and the command buffer 46 are shown in greater detail in the block diagram of FIG. 4. As shown in FIG. 4, a timing control circuit 206 includes a clock circuit 220 that receives a clock signal CLK and its quadrature CLK90 from a conventional quadrature circuit 222 responsive to the internal clock signal ICLK. The internal clock signal ICLK is generated by the clock control circuit 40 from the command clock signal CMDCLK, as explained above with reference to FIG. 3. The CLK and CLK90 signals are applied to a NOR gate 232, which outputs a high whenever ICLK and ICLK90 are both low. The output of the NOR gate 232 is applied through a first inverter 234 to generate a CLK1 signal and then through a second inverter 236 to generate a CLK1* signal (the "*" symbol after a signal name is used throughout to designate the compliment of the signal).

The CLK90 and CLK signals are also applied to a NAND gate 240, which outputs a low whenever both CLK and CLK90 are high. The output of the NAND gate 240 is coupled through an inverter 242 to generate a CLK0 signal and then through a second inverter 244 to generate CLK0* signal. These CLK0, CLK0*, CLK1, and CLK1* signals correspond to the ICLK signal described with reference to FIG. 3.

The clock generator circuit 40 also includes a pair of shift register circuits 246, 248 that are part of the shift register 202. The shift register circuits 246, 248 are connected in series with each other to form an 8-stage shift register. The shift register circuit 246 receives the FLAG signal, and the FLAG signal is then sequentially shifted through the four stages of the shift register circuit 246 and the four stages of the shift register circuit 248 responsive to the CLK0, CLK0*, CLK1, and CLK1* signals. As mentioned above, the FLAG signal is shifted through two stages of the shift register circuits 246, 248 each cycle of the CLK signals. Thus, when FLAG goes high, two successive F<0:7>outputs of the shift register circuits 246, 248 sequentially go high each clock cycle.

The shift register 202 shown in FIG. 4 also includes ten separate shift register circuits 250a–j, each of which receives a respective bit CA0–CA9 of the incoming 10-bit packet word coupled through respective buffers 251a–j. Each of the shift register circuits 250a–j includes four shift register stages. Thus, after tour clock cycles, four packet word bits CA have been shifted into each shift register circuit 250, and all four of these bits are available as a 4-bit word B<0:3>. Thus, the ten shift register circuits 250a–j collectively store and then output the 40-bit command word C<0:39>.

The storage register 208 also receives the CLK and CLK 90 signals. However, bits B<0:3>for the four packet words stored in the shift register 202 are not latched into the storage register 208 until the F<3>signal is generated as explained above. The F<3>signal is generated four transitions of the CLK signal after receipt of the FLAG signal, i.e., after four command packets have been shifted into the shift register 202. The storage register then stores and continuously outputs the 40-bit command word Y<0:39>. The command word Y<0:39>is used to control the operation of a memory device containing the command buffer 46 and clock generator circuit 40.

The structure and operation of the command buffer 46 are described in greater detail in U.S. patent application Ser. No. 08/994,461 to Manning, which is incorporated herein by reference.

It is important that the clock signals generated from the ICLK signal be applied to the shift registers 250a–j at the proper time so that packet words CA0–9 on the command bus 50 are latched when valid packet words are present on the command bus 50. Similarly, it is important that the clock signals generated from the ICLK signal be applied to the shift registers 246, 248 at the proper time so that the FLAG signal on the flag line 52 are latched when a valid FLAG signal is present on the flag line 52. If the ICLK signal does not latch the FLAG signal at the proper time, the memory device 16a will fail to recognize the start of a command packet or it may fail to do so at the proper time. At higher operating speeds, it can become very difficult to ensure that the ICLK signal has the proper timing to accurately latch the command packet and the FLAG signal.

Even if the timing at which the CMDCLK signal, the command packet CA, and the FLAG signal are applied to the memory device 16a could be precisely controlled, it would be difficult to precisely control or predict the propagation delay of these signals within the memory device 16a.

For example, internal signals require time to propagate to various circuitry in the memory device 16a. Differences in the signal path lengths can cause differences in the times at which signals reach the circuitry. Differences in capacitive loading of signal lines can also cause differences in the times at which signals reach the circuitry. These differences in arrival times can become significant at high operating speeds, and eventually limit the operating speed of memory devices.

The difficulty in clocking the packet words CA0–9 and the FLAG signal into the shift registers at the proper time can be explained with reference to FIG. 5. A bit of a command packet or the FLAG signal is shown in the upper portion of FIG. 5 having a leading edge occurring at $t_1$ and a trailing edge occurring at $t_5$. The internal clock signal is shown having a rising edge occurring at $t_3$, which is midway between $t_1$ and $t_5$. However, as explained above, a variety of factors can alter the relative timing of the packet words and the FLAG signal relative to the ICLK signal as those signals are coupled to the memory device 16a and propagate through the memory device 16a to the shift register 202. As a result, the packet words CA0–9 and the FLAG signal may have a phase relative to each other that varies considerably. The packet word CA0–9 and the FLAG signal may be applied to the shift registered 202 at a time relative to the ICLK signal starting at $t_0$, in which case it would terminate at time $t_2$. The packet word CA0–9 and the FLAG signal may also be applied to the shift registered 202 at a time relative to the ICLK signal starting at $t_4$, in which case it would terminate after time $t_5$. Under these circumstances, the transition of the ICLK must occur during the shaded portion of the packet word CA0–9 and FLAG signal between $t_2$ and $t_4$. It can therefore be seen that there is very little tolerance in the phase of the ICLK signal relative to the phases of the packet word CA0–9 and the FLAG signal.

The command buffer 46 illustrated in FIGS. 3 and 4 is able to precisely control the timing of the ICLK signal because the clock control circuit 40 adaptively adjusts the phase of the ICLK signal relative to the CMDCLK signal so that the shift register 202 is clocked at the proper time. As explained in greater in the above-cited U.S. patent application Ser. No. 08/890,055 to Baker et al., during initialization of the memory device 16a, an initialization packet having a known data pattern is repetitively applied to the shift register 202 along with an initialization FLAG signal. As explained above, the initialization FLAG signal is a FLAG signal that is initially high for a duration that is twice the duration of the FLAG signal during normal operation. Thus, two adjacent FLAG bits. e.g., F<0> and F<1>, can both be logic "1". In contrast, as mentioned above, only one FLAG bit can be logic "1" during normal operation of the memory device 16a. The NAND gate 212 (FIGS. 3 and 4) is used to detect the initialization FLAG signal by detecting when the F<0> and F<1>FLAG bits are both logic "1".

As further described in the Baker et al. application, during the initialization process, a predetermined initialization packet and a predetermined pattern of FLAG bits are repetitively shifted into the shift register 202. The packet words in the initialization packet and the FLAG bits are repetitively stored in the shift register 202 using different phases of the ICLK signal, as determined by an internal logic circuit (not shown). The bits of the packet words and the FLAG bits stored in the shift register 202 responsive to each phase of ICLK are then examined, and a determination is made of which phase of the ICLK signal was best able to capture the packet words and FLAG bits. The logic circuit then applies PHASE bits corresponding to the optimum phase of the ICLK signal to the clock generator 40. Thereafter, the clock generator 40 delays the ICLK signal relative to the CMD-CLK signal so that the transition of the ICLK signal occurs at the approximate center of the capture window between $t_2$ and $t_4$, as illustrated in FIG. 5.

As explained above, during normal operation of the memory device 16a, the FLAG signal transitions high for one bit, as illustrated in FIG. 6. As further shown in FIG. 6, the ICLK signal has been adjusted during the initialization procedure explained above so that it transitions at the center of the FLAG bit. The high FLAG signal is clocked into the shift registered 202 thereby making the F<0> bit logic "1." On each successive transition of the ICLK signal, the logic "1" is shifted through each successive stage of the shift register 202, thereby sequentially making each of the F<1>–F<7>bits logic "1". The logic level clocked into the shift register 202 is shown below each of the strobe arrows coincident with each transition of the ICLK signal.

The initialization FLAG signal is shown to being clocked into the shift register 202 in FIG. 7. As mentioned above, the initialization FLAG signal is twice the width of the FLAG signal occurring during normal operation. The ICLK signal is shown in FIG. 7 with its transitions occurring at the 25% and 75% portions of the double—width FLAG signal. The FLAG signal as stored in the shift register 202 is thus "0" "1" "1" "0" "0" "0", etc. so that at the second transition of ICLK, the F<0> and F<1>bits are both logic "1", which is detected by the NAND gate 212.

The ICLK signal is shown in FIGS. 6 and 7 as having a phase relative to the phase of the FLAG signal that allows the ICLK signal to accurately strobe the FLAG signal. Proper phasing of the ICLK signal is insured by the initialization procedure for normal operation, as illustrated in FIG. 6. However, since the initialization FLAG signal shown in FIG. 7 is generated to signify the start of the initialization procedure, the initialization procedure has not yet occurred when the initialization FLAG signal is applied to the shift register 202. Therefore, it is possible for the phase of the ICLK signal relative to the phase of the initialization FLAG signal to be as illustrated in FIG. 8. Under these conditions, the transitions of the ICLK signal coincide with the transitions of the initialization FLAG signal so that the logic level clocked into the shift register 202 on those transitions of ICLK is indeterminate. However, the transition of ICLK occurring at the center of the initialization FLAG signal is properly registered as a logic "1". The initialization FLAG signal as stored in the shift register 202 could thus be "110" to properly signify the start of the initialization procedure, but it could also be "010" to signify a normal FLAG signal or "111", which signifies neither a normal FLAG signal nor an initialization FLAG signal.

The need to select the phase of the ICLK signal during the initialization procedure before the initialization FLAG signal signifying the start of the initialization procedure can be accurately detected creates an apparent inability to reliably initiate the initialization procedure. As a result, although the above—described initialization procedure is capable of insuring accurate synchronization of the ICLK signal to the packet words CA0–9 and the FLAG signal, there is no apparent technique for reliably detecting the initialization FLAG signal in order to initiate the initialization procedure.

SUMMARY OF THE INVENTION

The invention is directed to a method and apparatus for detecting an initialization flag signal in a packetized DRAM. The DRAM is adapted to receive a command packet, a command clock, and either the initialization flag signal or a normal flag signal, which are applied to a flag input terminal of the DRAM. The initialization flag signal is received prior to initialization of the DRAM, and the normal flag signal is received during normal operation of the DRAM. The normal flag signal has a duration that is substantially shorter than, preferably half, the duration of the initialization flag. In accordance with the inventive method and apparatus, the flag input terminal is sampled by a suitable device, such as a plurality of latches or a shift register. The flag input terminal is sampled at a rate that is sufficiently higher than a plurality of samples, preferably at least 4, are taken during the duration of the initialization flag signal. The number of contiguous samples corresponding to a predetermined logic level, such as the logic level of the flag signals, is determined. A determination is then made whether the number of these contiguous samples were taken over duration that is longer than the duration of the normal flag signal. In another aspect of the invention, a command packet and a flag signal having predetermined patterns are applied to the DRAM. The bits of the command packet are then sampled along with the flag signal, and the samples of the flag signal are compared to the samples of each bit of the command packet. If the comparison indicates that the pattern of the flag signal does not correspond to the pattern of the command packet, an error signal is generated. The inventive method and apparatus may be included in a command buffer for the packetized DRAM, and the packetized DRAM incorporating the inventive method and apparatus may be used in a computer system.

DETAILED DESCRIPTION OF THE INVENTION

Figure 3:
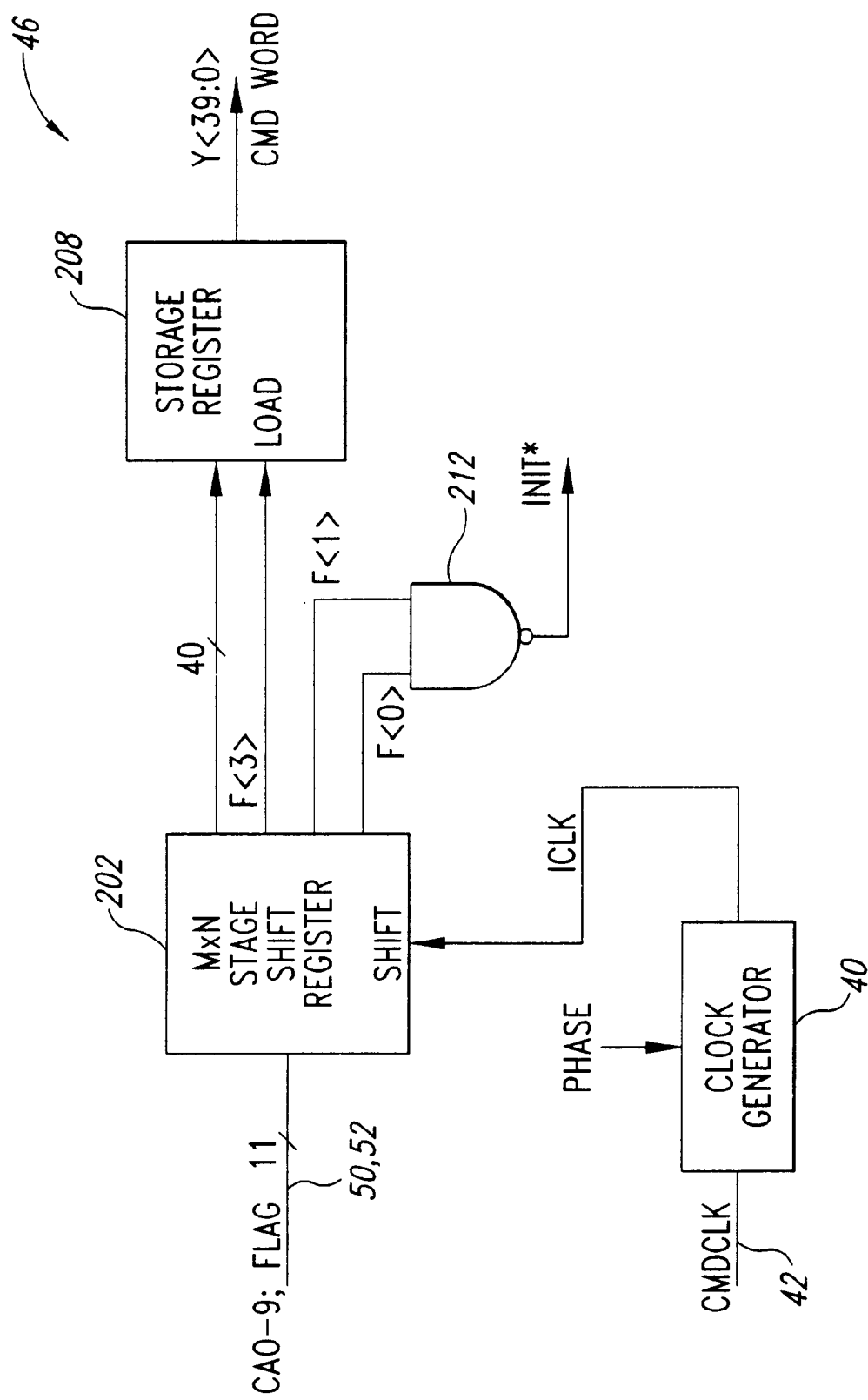
FIG. 3 is a block diagram of a preferred embodiment of a portion of a command buffer and clock generator circuit in accordance with the invention that is usable in the packetized DRAM of FIG. 2.
Figure 9:
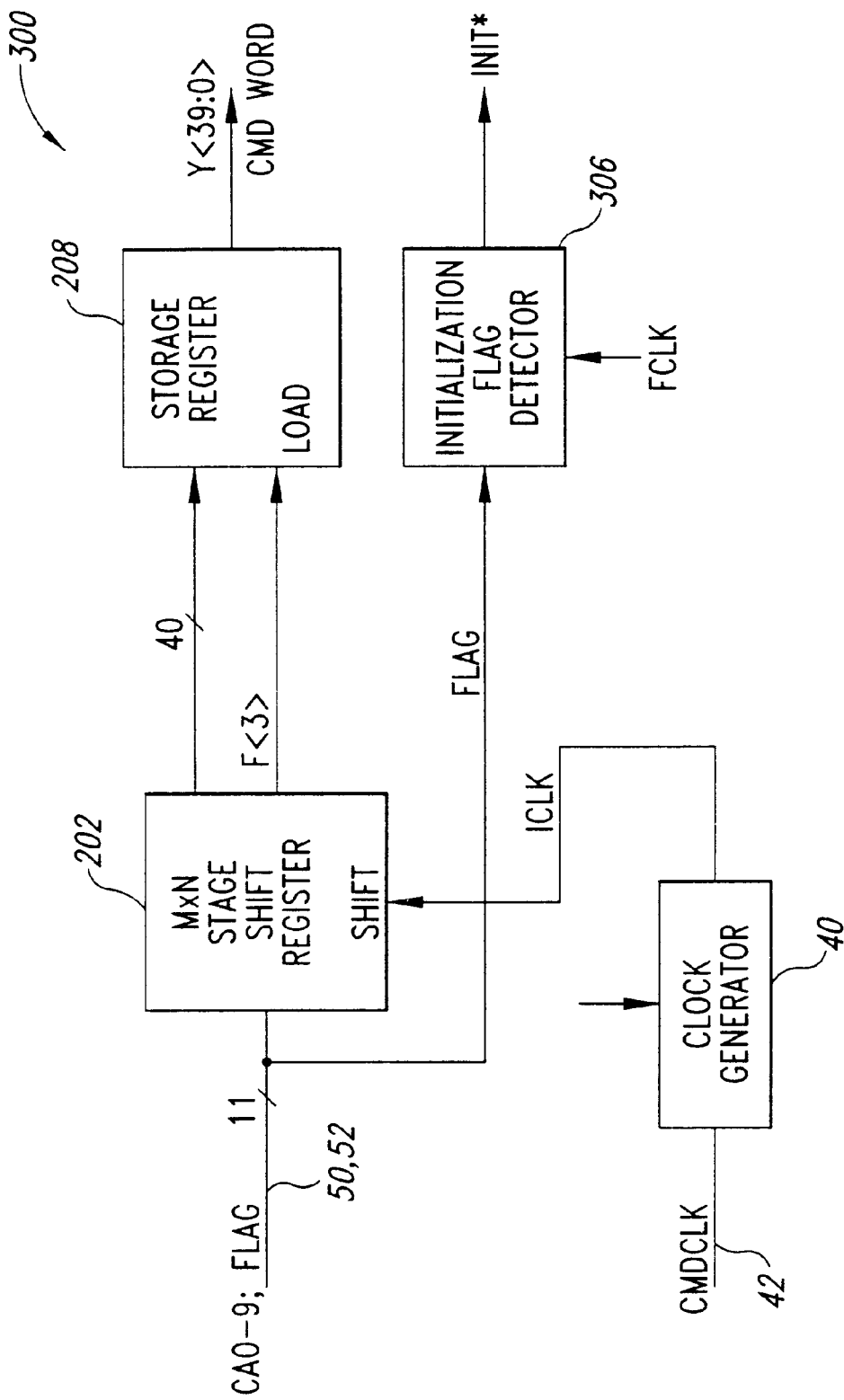
FIG. 9 is a block diagram of the command buffer of FIG. 3 having an initialization FLAG Detector in accordance with one embodiment of the invention.

One embodiment of a command buffer 300 in accordance with the invention is illustrated in FIG. 9. The command buffer 300 includes the shift register 202, the storage register 208 and the clock generator circuit 40 from the command buffer 48 of FIG. 3. These components operate in the same manner as explained above unless otherwise noted. Therefore, their operation will not be repeated with reference to FIG. 9. The command buffer 300 does not include the NAND gate 212 of FIG. 3 because the INIT* signal is instead generated by an Initialization Flag Detector 306.

The Initialization Flag Detector 306 receives the FLAG signal and a flag clock signal FCLK. As explained further below, the FCLK signal has a frequency that is higher than the frequency of the internal clock signal ICLK. The FCLK signal is preferably generated from the ICLK signal and is preferably an integer of multiple of the ICLK signal. However, the FCLK signal may be generated independently of the ICLK signal as long as it has a frequency that is higher than the frequency of the ICLK signal.

Figure 10:
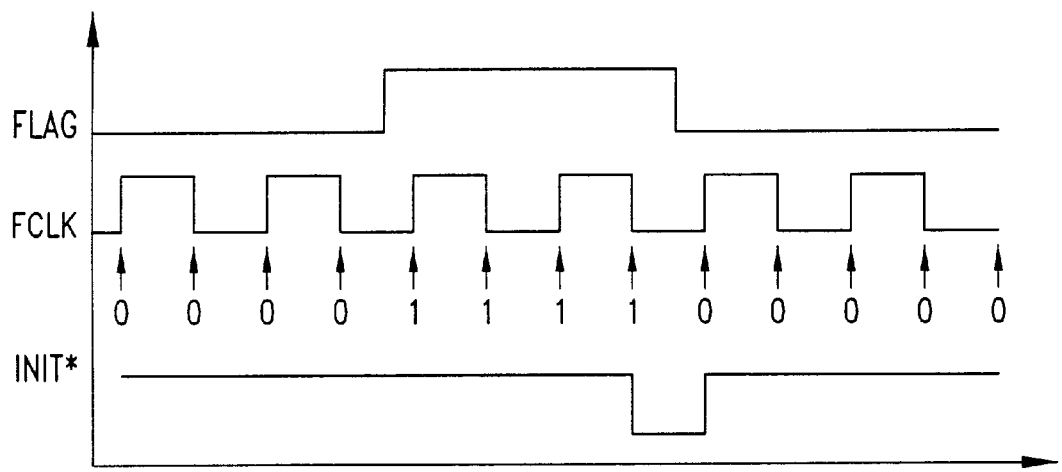
FIG. 10 is a timing diagram showing the operation of the command buffer of FIG. 9 upon receipt of an initialization FLAG signal having a first phase relationship with an internal clock signal.

The operation of the initialization applied detector 306 can best be explained with reference to FIG. 10. As illustrated in FIG. 10, the FCLK signal has a frequency that is twice the frequency of the FCLK signal. Since the width of the initialization FLAG signal is equal to the period of the ICLK signal, there are at least 4 transitions of the FLAG signal during every initialization FLAG signal.

Figure 11:
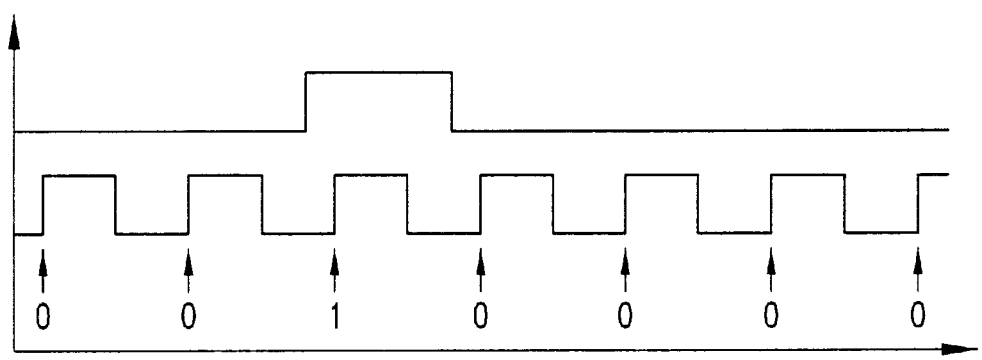
FIG. 11 is a timing diagram showing the operation of the command buffer of FIG. 9 upon receipt of a normal FLAG signal having a first phase relationship with an internal clock signal.

The logic levels strobed by the FCLK signal in the Initialization Flag Detector 306 are indicated in the fourth line of FIG. 10. As shown therein, the initialization FLAG signal results in 4 logic "1" samples being strobed. In contrast, as shown in FIG. 11, the normal FLAG signal results in only 1 logic "1" sample being strobed in the Initialization Flag Detector 306, since the normal FLAG signal has one-half the duration of the initialization FLAG signal. By appropriate processing of these samples, the Initialization Flag Detector 306 is able to detect the initialization FLAG and distinguish it from the normal FLAG signal. Examples of circuitry for processing these samples will be described in detail below. The Initialization Flag Detector 306 also includes circuitry for generating the INIT* signal in response to detecting the initialization FLAG signal.

Figure 12:
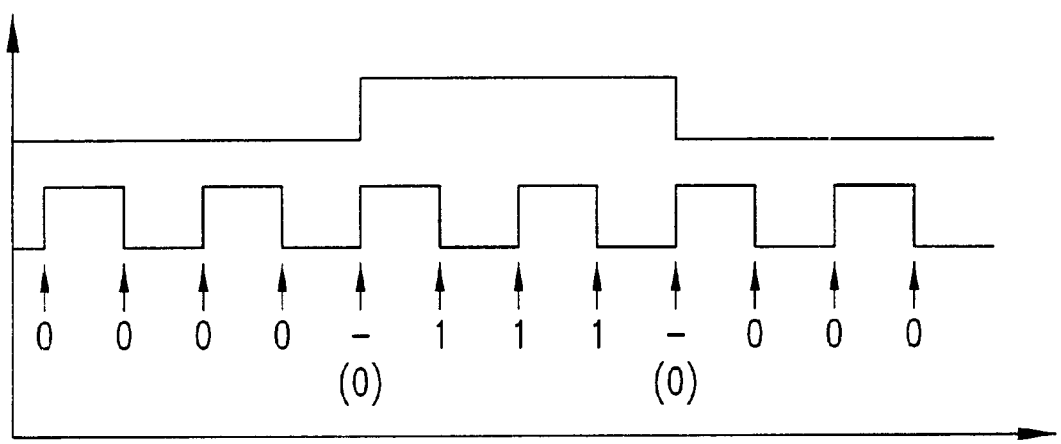
FIG. 12 is a timing diagram showing the operation of the command buffer of FIG. 9 upon receipt of an initialization FLAG signal having a second phase relationship with an internal clock signal.
Figure 13:
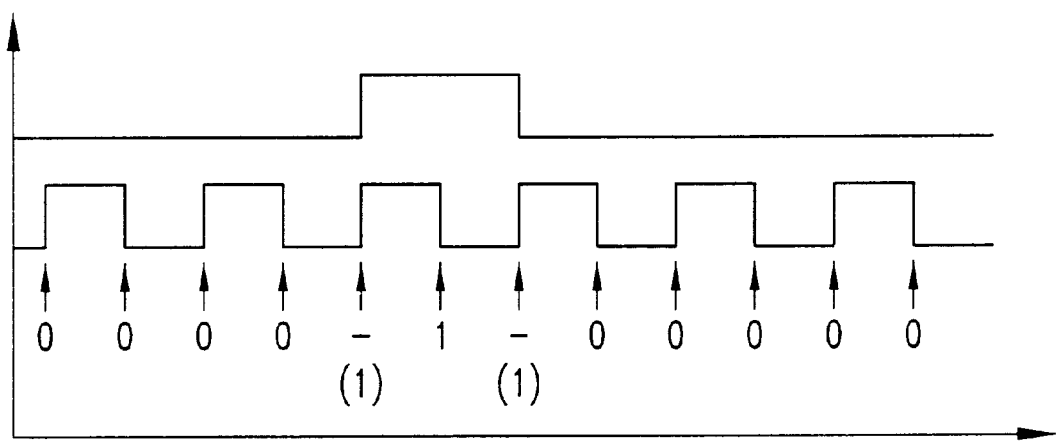
FIG. 13 is a timing diagram showing the operation of the command buffer of FIG. 9 upon receipt of a normal FLAG signal having a second phase relationship with an internal clock signal.

It appears from an examination of FIGS. 10 and 11 that sampling the FLAG signals at a frequency of twice the frequency of the ICLK signal would be sufficient to always allow the initialization FLAG signal to be distinguished from the normal FLAG signal. Although that will generally be the case, it is possible for incorrect results to be obtained by sampling the FLAG signals at twice the frequency of the ICLK signal, as illustrated in FIGS. 12 and 13. With reference to FIG. 12, when the transitions of the FCLK signal coincide with the transitions of the initialization FLAG signal, indeterminate logic levels may be strobed in the Initialization Flag Detector 306 during the transitions. Thus, the samples of the initialization FLAG signal strobed into the shift register 202 may be " . . . 0111110 . . . ", " . . . 0011110 . . . ", " . . . 0111100 . . . ", or, in the worst case, " . . . 0011100 . . . " in which only 3 logic "1" samples are obtained.

With reference to FIG. 13, when the transitions of the FCLK sional coincide with the transitions of the normal FLAG signal, indeterminate logic levels may also be strobed in the Initialization Flag Detector 306 during the transitions. Thus, the samples of the normal FLAG signal strobed into the shift register 202 may be " . . . 00100 . . . ", " . . . 01100 . . . ", " . . . 00110 . . . ", or, in the worst case " . . . 01110 . . . " in which there are also 3 logic "1" samples obtained. Under these circumstances, it would not be possible to distinguish between an initialization FLAG signal from which 3 logic "1" samples were obtained and a normal FLAG signal from which 3 logic "1" samples were obtained. Thus, detection errors are theoretically possible by sampling the FLAG signals at only twice the frequency of the ICLK signal. However, in practice, the Initialization Flag Detector 306 will generally operate consistently during the first and second coincident transitions of the FCLK signal and the FLAG signal. For example, if the sample obtained by the Initialization Flag Detector 306 coincident with the loading edge of the FLAG signal corresponds to the FLAG signal before that transition (and thus samples a logic "0"), the sample obtained by the Initialization Flag Detector 306 coincident with the trailing edge of the FLAG signal will also correspond to the FLAG signal before that transition (and thus sample a logic "1"). In practice, therefore, it will generally be acceptable to sample the FLAG signals at twice the frequency of the ICLK signal.

Although sampling at twice the frequency of the ICLK signal will usually not produce erroneous results, the potential problem described above can be eliminated by sampling using a higher frequency FCLK signal, as explained further below. Generally, the number of logic "1" samples produced by strobing the initialization FLAG signal with the FCLK signal will approach twice the number of logic "1" samples produced by strobing the FLAG signal with the FCLK signal as the frequency of the FCLK signal increases. More specifically, if N+1 strobe signals (i.e., transitions of FCLK) are applied to the initialization flag detector 306 during the initialization FLAG, the minimum number of logic "1" bits that can be detected is N+1−2=N−1 because two of the strobe signals may have occurred during the transition of the initialization FLAG signal. When the same frequency strobe signal is used to strobe the FLAG signal that occurs during normal use, the maximum number of logic "1" samples that can be generated is N/2+1, which assumes that two strobe signals applied to the initialization flag detector 306 during the transitions of the FLAG signal are registered as logic "1" samples. For the initialization flag detector 306 to be able to distinguish between the normal FLAG signal and the initialization FLAG signal, the number of samples strobed as logic "1" for the initialization FLAG signal must be greater than the number of samples strobed as logic "1" for the normal FLAG signal. Thus, the term N−1 must be greater than N/2+1, which can be solved for N as: N>4. Therefore, for the initialization flag detector 306 to unambiguously distinguish between the normal FLAG signal and the initialization FLAG signal, there must be more than 5 (N+1) transitions of the FCLK signal during the initialization FLAG signal. This frequency of the FCLK signal corresponds to a frequency that is greater than twice the frequency of the ICLK signal.

Figure 14:
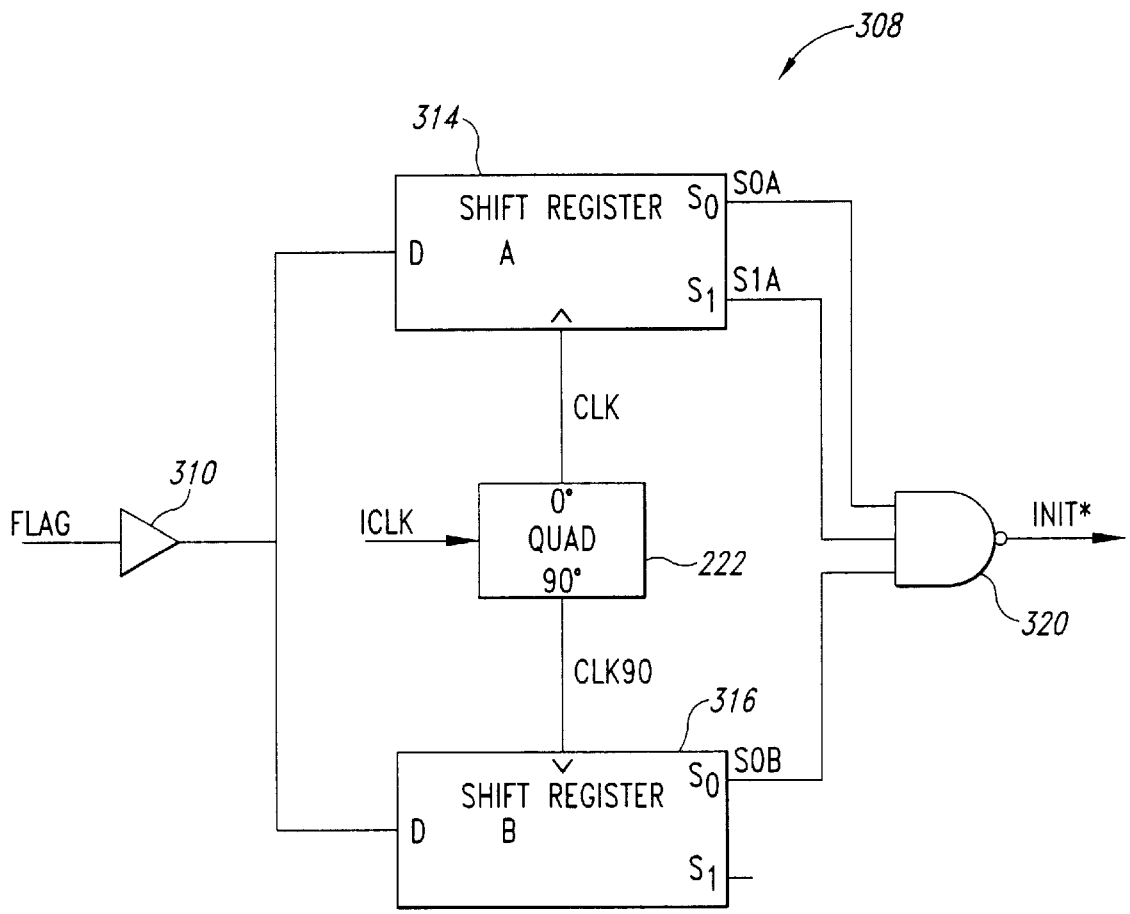
FIG. 14 is a block diagram of one embodiment of a Initialization Flag Detector that may be used in the command buffer of FIG. 9.

There are several techniques that may be used by the Initialization Flag Detector 306 to distinguish the initialization FLAG signal from the normal FLAG signal. One embodiment of the Initialization Flag Detector 306, which is illustrated in FIG. 14, samples at twice the frequency of the ICLK signal, as illustrated in FIG. 12 and 13. As explained above, at least 3 successive samples of the FLAG signals must be obtained at this frequency to distinguish the normal FLAG signal from the initialization FLAG signal. With reference to FIG. 14, an Initialization Flag Detector 308 includes a buffer 310 to which the FLAG signals (both normal and initialization) are applied. The buffer 310 applies the FLAG signals to data inputs D of a pair of two-stage shift registers 314, 316. The shift registers 314, 316 each include a clock input adapted to receive a clock signal. On each transition of the clock signal applied to the clock input, the logic level at a signal applied to the D input to the each shift register 314, 316 is stored in the shift register 314, 316 and coupled to its S0 output. At the same time, the logic level of the signal previously at the S0 output is shifted to the S1 output of each shift register 314, 316. Since only three samples are required, one of the outputs of one of the shift registers 314, 316 need not be used. In the embodiment of FIG. 14, the S1 output of the shift register 316 is not used. Thus, a conventional latch may be used instead of the shift register 316.

Figure 4:
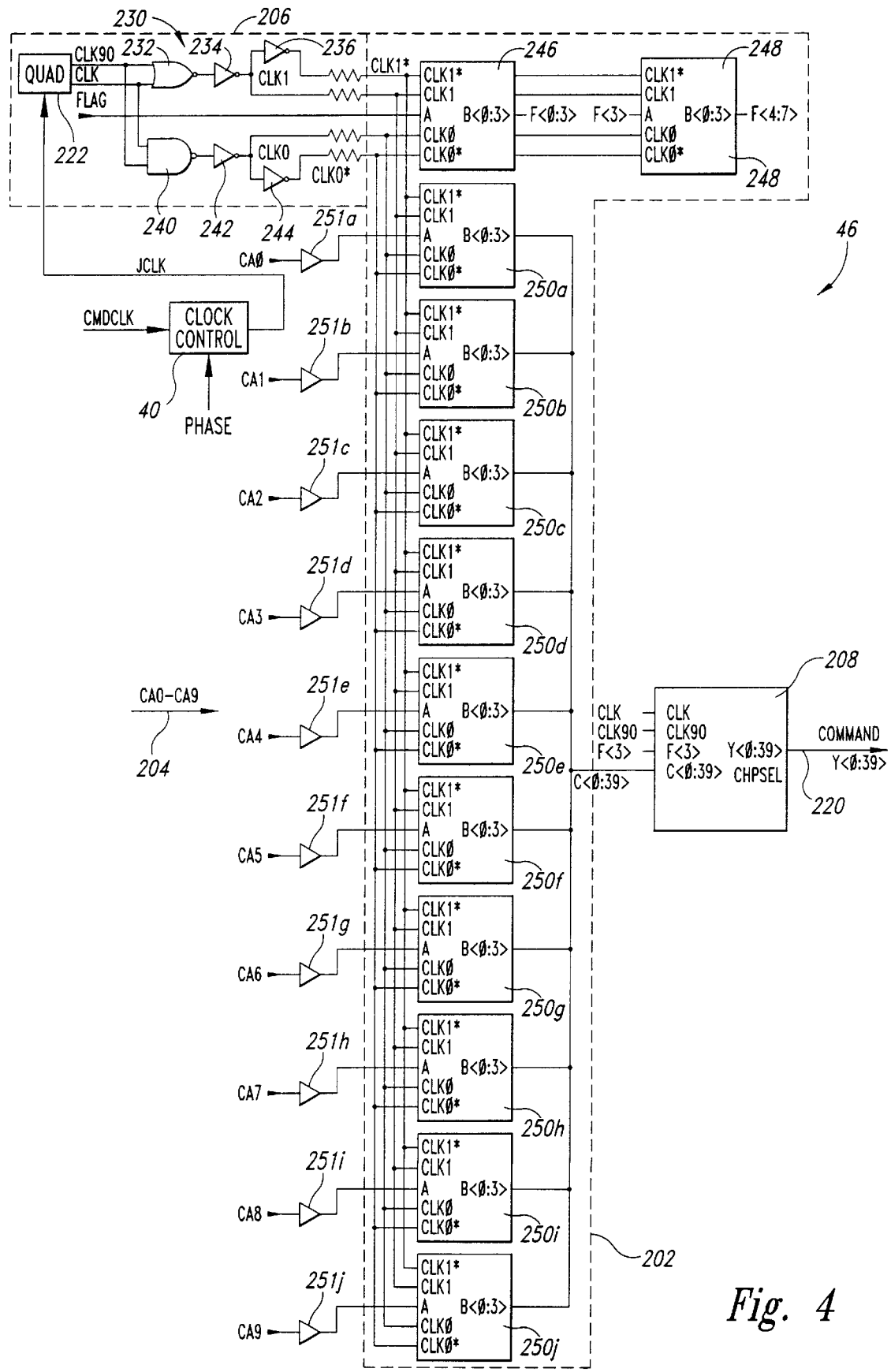
FIG. 4 is a more detailed block diagram of the portion of the command buffer and clock generator circuit shown in FIG. 3.
Figure 5:
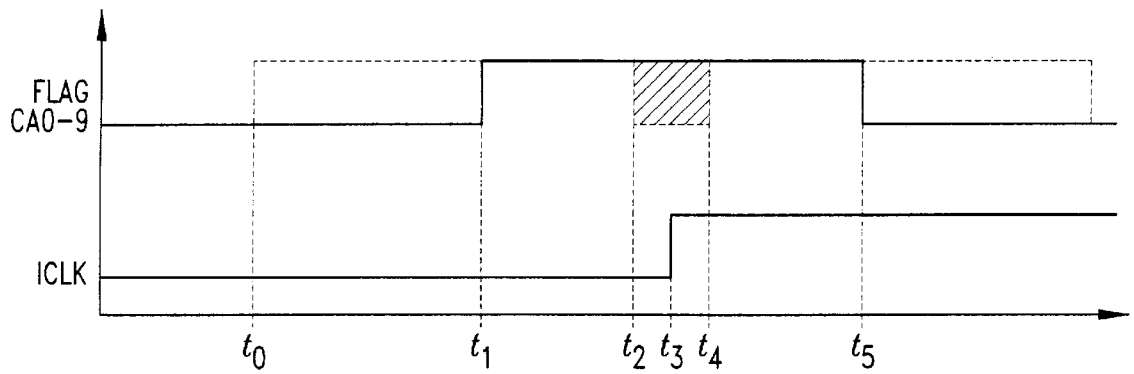
FIG. 5 is a timing diagram illustrating a capture window corresponding to phases of the ICLK signal that are capable of accurately strobing packet words CA0–9 and a FLAG signal into a shift register in the command buffer of FIGS. 3 and 4.
Figure 6:
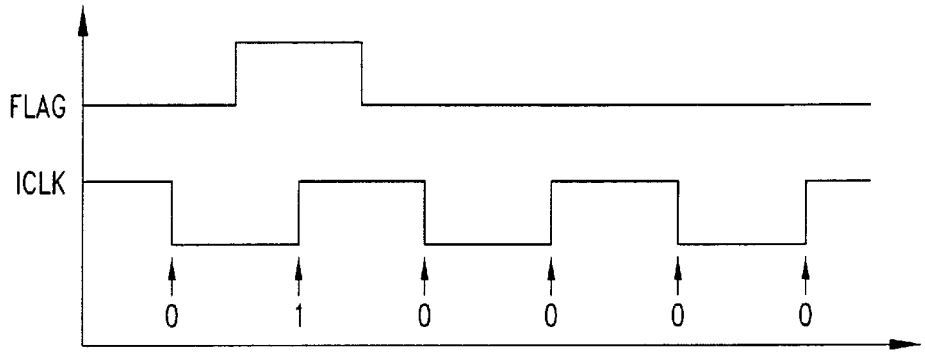
FIG. 6 is a timing diagram illustrating the ICLK signal strobing the FLAG signal into a shift register in the command buffer of FIGS. 3 and 4.
Figure 7:
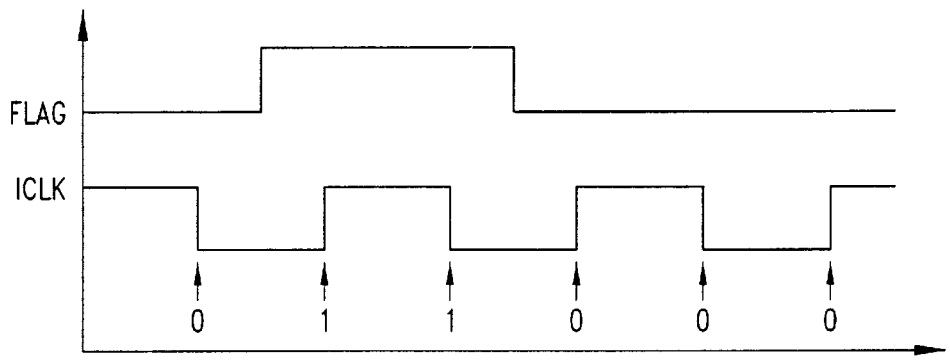
FIG. 7 is a timing diagram illustrating the ICLK signal having a first phase relative to the phase of an initialization FLAG signal strobing the initialization FLAG signal into a shift register in the command buffer of FIGS. 3 and 4.
Figure 8:
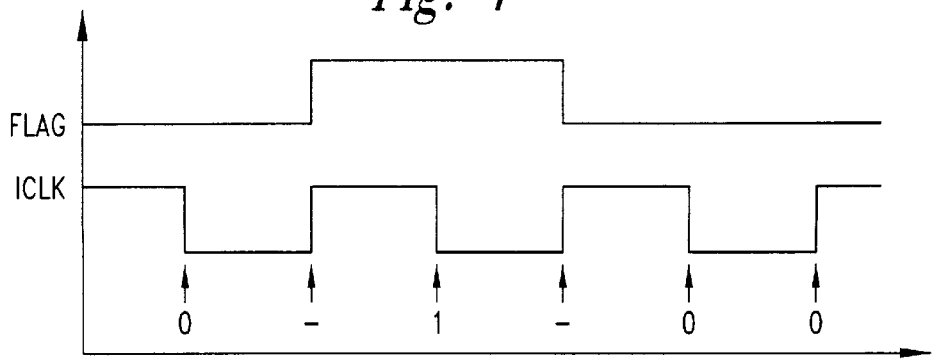
FIG. 8 is a timing diagram illustrating the ICLK signal having a second phase relative to the phase of the initialization FLAG signal unsuccessfully attempting to strobe the initialization FLAG signal into a shift register in the command buffer of FIGS. 3 and 4.

The clock signals applied to the clock inputs of the shift registers 314, 316 are generated by the quadrature circuit 222 (FIG. 4) from the internal clock signal ICLK. Thus, the quadrature circuit 222 applies to the shift register 314 a clock signal CLK in phase with the ICLK signal and applies to the shift register 316 a clock signal CLK90 leading or lagging the ICLK signal by 90 degrees.

The outputs of the latch are coupled to respective inputs of a NAND gate 320, which generates the active low INIT* signal when 3 successive samples of the FLAG signal are logic "1".

Figure 15:
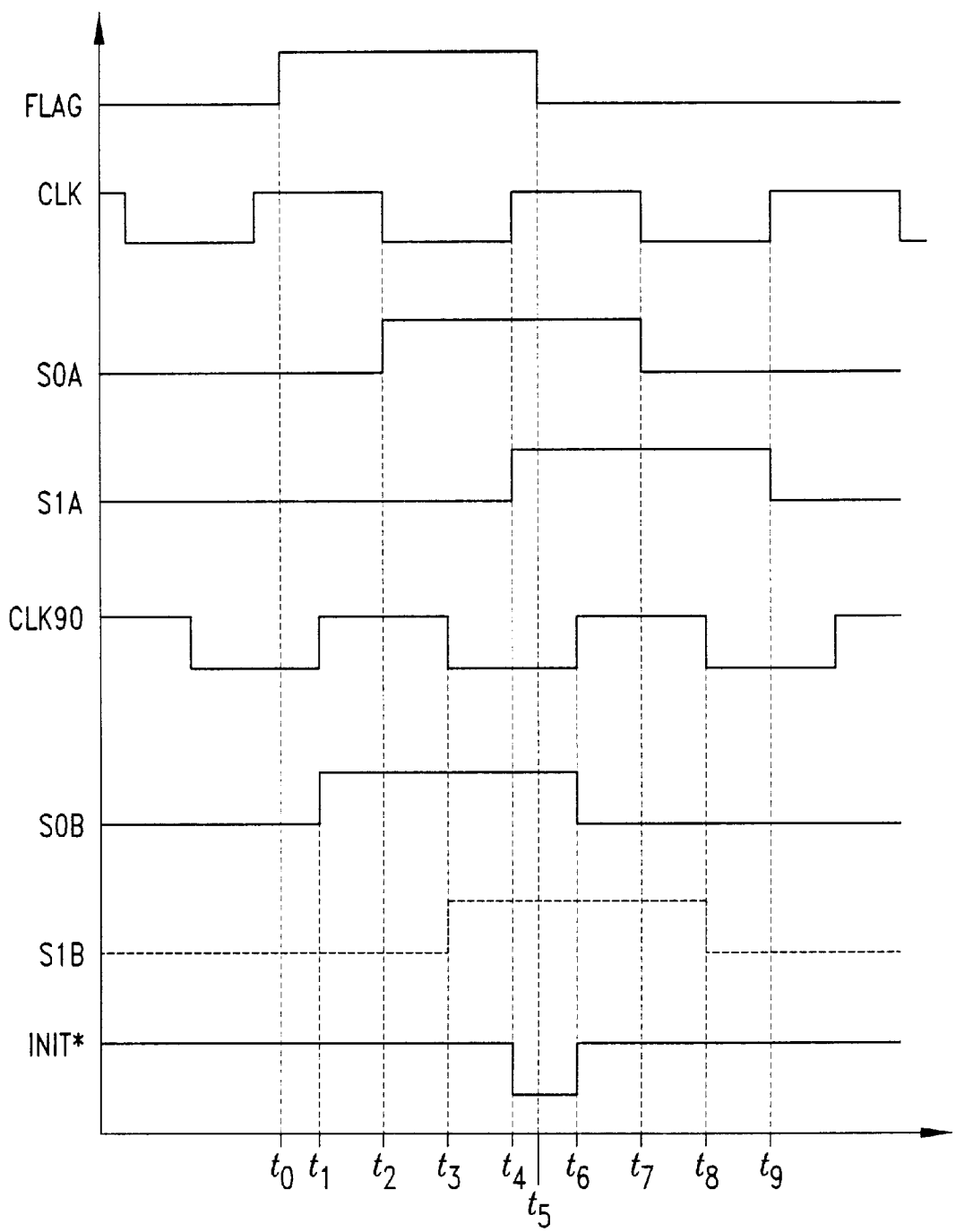
FIG. 15 is a timing diagram showing the operation of the Initialization Flag Detector of FIG. 14 upon receipt of an initialization FLAG signal.
Figure 16:
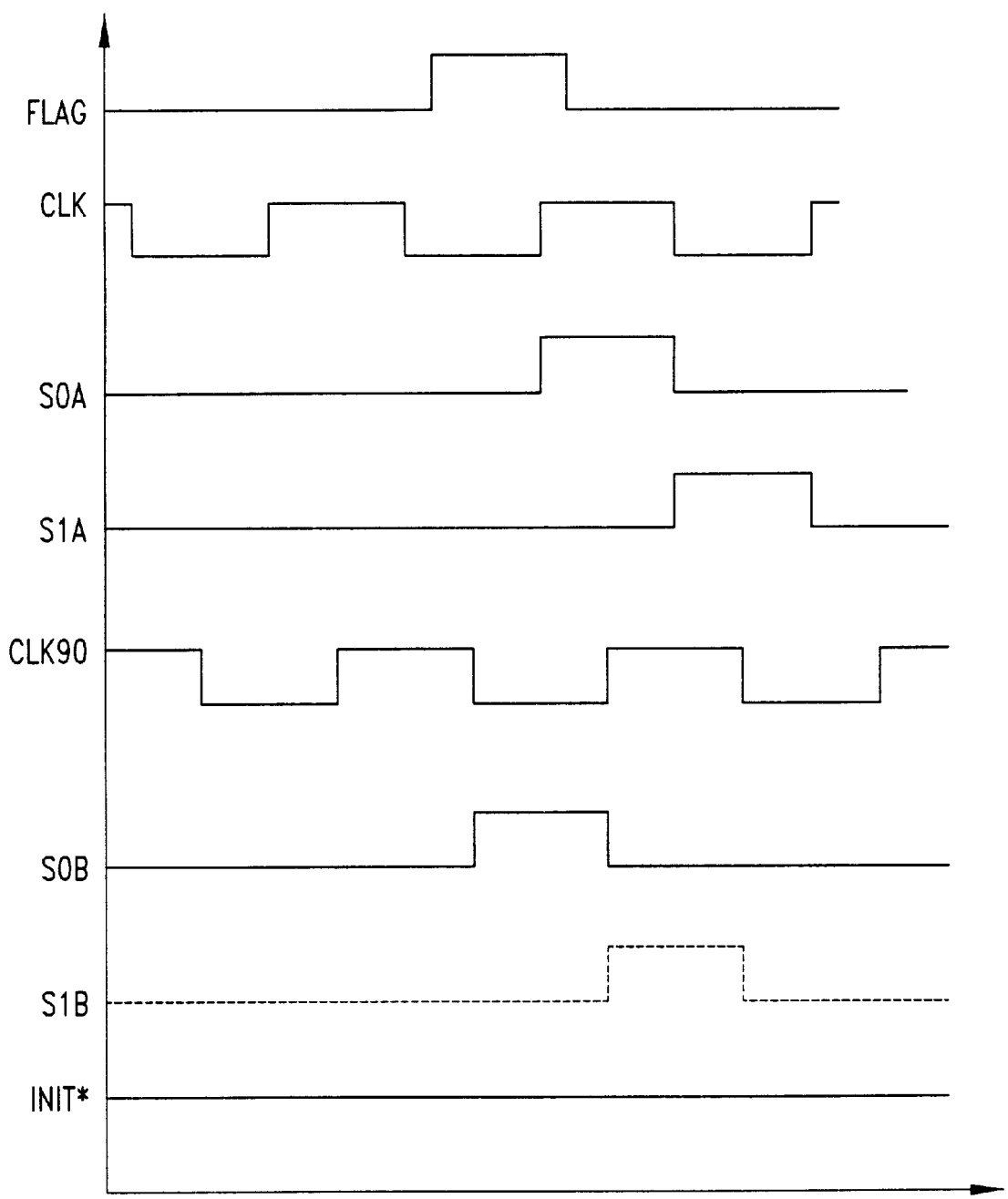
FIG. 16 is a timing diagram showing the operation of the Initialization Flag Detector of FIG. 14 upon receipt of a normal FLAG signal.

The operation of the Initialization Flag Detector 308 will now be explained with reference to FIGS. 15 and 16. As shown in FIG. 15, the CLK signal applied to the shift register 314 has the same frequency and phase as the ICLK signal, and the CLK90 signal applied to the shift register 316 lags the CLK is signal by 90 degrees. However, the CLK90 signal may lead the CLK signal by 90 degrees, and the Initialization Flag Detector 308 will operate in the same manner. As shown in FIG. 15, the leading-edge of the FLAG signal occurs at time $t_0$. On the next transition of the CLK signal at time $t_2$, the high logic level of the FLAG signal is clocked into the shift register 314, thereby causing the S0A output of the shift register 314 to transition high. On the next transition of the CLK signal at time $t_4$, the high at the S0A output of the shift register 314 is clocked to the S1A output of the shift register 314. However, since the FLAG signal is still high at time $t_4$, a high is also clocked into the first stage of the shift register 314 so that the logic level at the S0A output of the shift register 314 remains high. The FLAG signal then transitions low at time $t_5$. On the next transition of the CLK signal at time $t_7$, the low FLAG signal is clocked into the first stage of the shift register 314, thereby causing the S0A output of the shift register 314 to transition low. The high from the first stage of the shift register 314 is clocked to the second stage of the shift register 314 at time $t_7$, so that the S1A output of the shift register 314 remains high. Thereafter, on the next transition of the CLK signal at the time $t_9$, the low stored in the first stage of the shift register 314 is clocked to the second stage of the shift register 314, thereby causing the S1A output to transition low.

The shift register 316 operates in the same manner as the shift register 314 except that it is clocked by the CLK90 signal rather than by the CLK signal, and only the S0B output of the shift register 316 is used. The S0B output transitions high at time $t_3$, i.e., on the first transition of the CLK90 signal after the FLAG signal goes high. The S0B output of the shift register 316 subsequently translations low at time $t_6$, i.e., on the first transition of the CLK90 signal after the FLAG signal goes low.

It is apparent from an examination of FIG. 15 that, between time $t_4$ and time $t_6$, all of the outputs of the shift registers 314, 316 are high. The NAND gate 320 to which the outputs of the shift registers 314, 316 are applied then outputs an active low INIT* signal.

The operation of the Initialization Flag Detector 308 responsive to a normal FLAG signal will now be explained with reference to FIG. 16. On the first transition of the CLK signal after the FLAG signal goes high, the S0A output of the shift register 314 transitions high. Thereafter, on the next transition of the CLK signal, the high in the first stage of the shift register 314 is shifted to the second stage of the shift register, thereby causing the S1A output of the shift register 314 to go high. However, since the FLAG signal has transitioned low prior to that time, a low is then shifted into the first stage of the shift register 314, thereby causing its S0A output to transition low. For this reason, the S0A and S1A outputs of the shift register 314 are never a both high at the same time. The NAND gate 320 cannot, therefore, generate an active low INIT* signal even though the S0B output of the shift register 316 transitions high at the same time that the S0A output of the shift register 314 is high. The Initialization Flag Detector is thus able to distinguish between a normal FLAG signal and an initialization FLAG signal.

The Initialization Flag Detector 308 of FIG. 14 can be modified as desired to accommodate specific design goals. For example, a greater number of the samples may be taken during each FLAG signal by coupling the FLAG signal to additional shift registers (not shown) which receive respective clock signals having incrementally increasing phases between the CLK signal and the CLK90 signal. The FLAG signal may also be sampled at a faster rate by applying a clock signal having a frequency that is higher than the frequency of the ICLK signal to one or more shift registers having a larger number of stages. For example, a single 16—stage shift register clocked at eight times the frequency of the ICLK signal would store 16 samples during each initialization FLAG signal. These 16 samples would then be applied to a logic circuit performing an AND function to generate the INIT* signal. Other variations can also be used.

Figure 17:
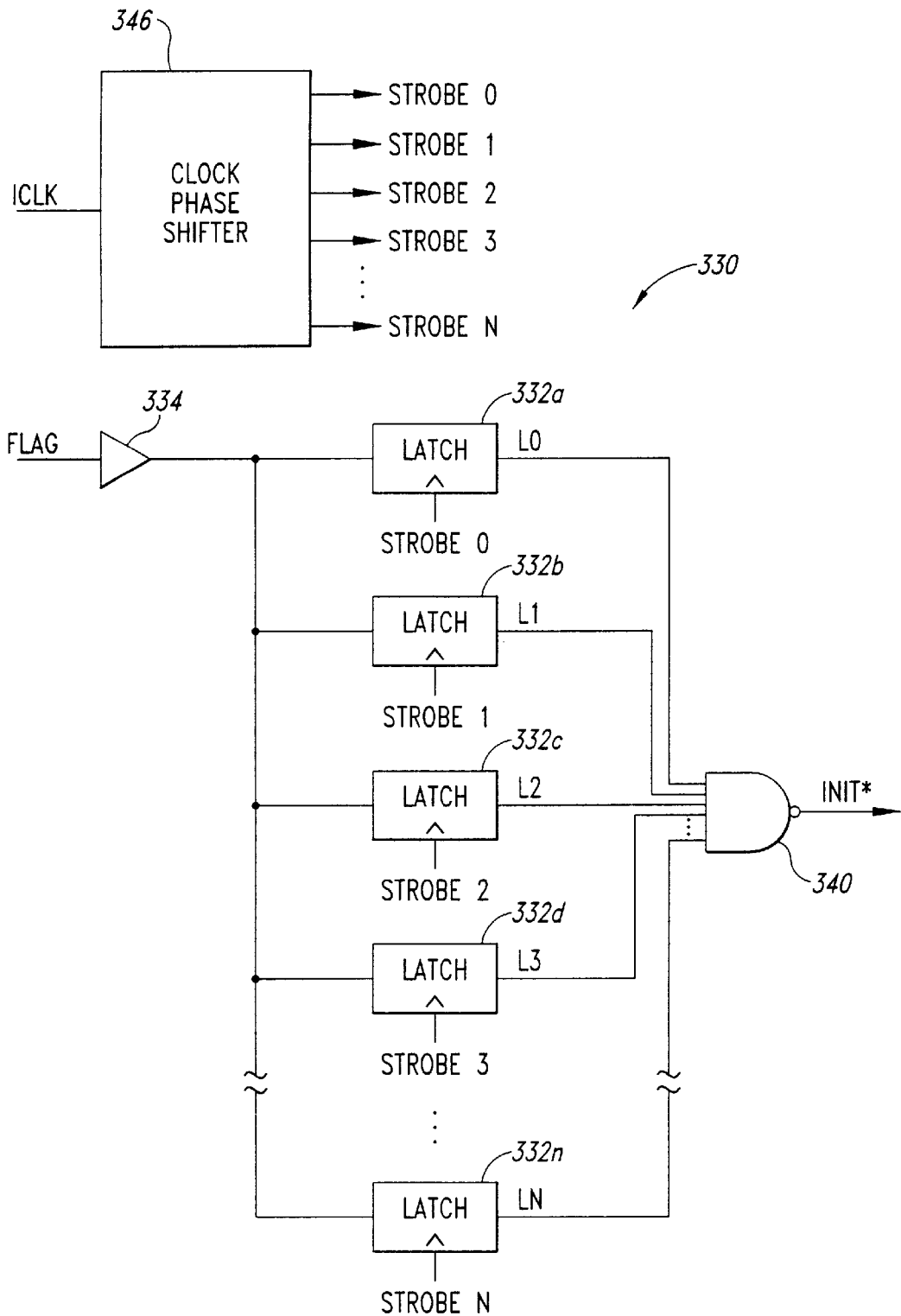
FIG. 17 is a block diagram of another embodiment of a Initialization Flag Detector that may be used in the command buffer of FIG. 9.

Another embodiment of an Initialization Flag Detector 330 for sampling the FLAG signals at a rate sufficient to distinguish the initialization FLAG signal from the normal FLAG signal is illustrated in FIG. 17. The Initialization Flag Detector 330 includes a plurality of single-bit latches 332a–332n that receive the FLAG signals through a buffer 334. The latches 332a–332n are clocked by respective strobe signals STROBE 0—STROBE N. As explained below, the strobe signals STROBE 0—STROBE N incrementally increase in phase relative to the internal clock signal ICLK from the STROBE 0 signal to the STROBE N signal. The outputs of the latches 332a–332n are applied to respective inputs of a NAND gate 340. The NAND gate 340 outputs an active low INIT* signal when all of its inputs are high.

The strobe signals STROBE 0—STROBE N are generated from the ICLK signal in a conventional manner by a clock phase shifter 346.

Figure 18:
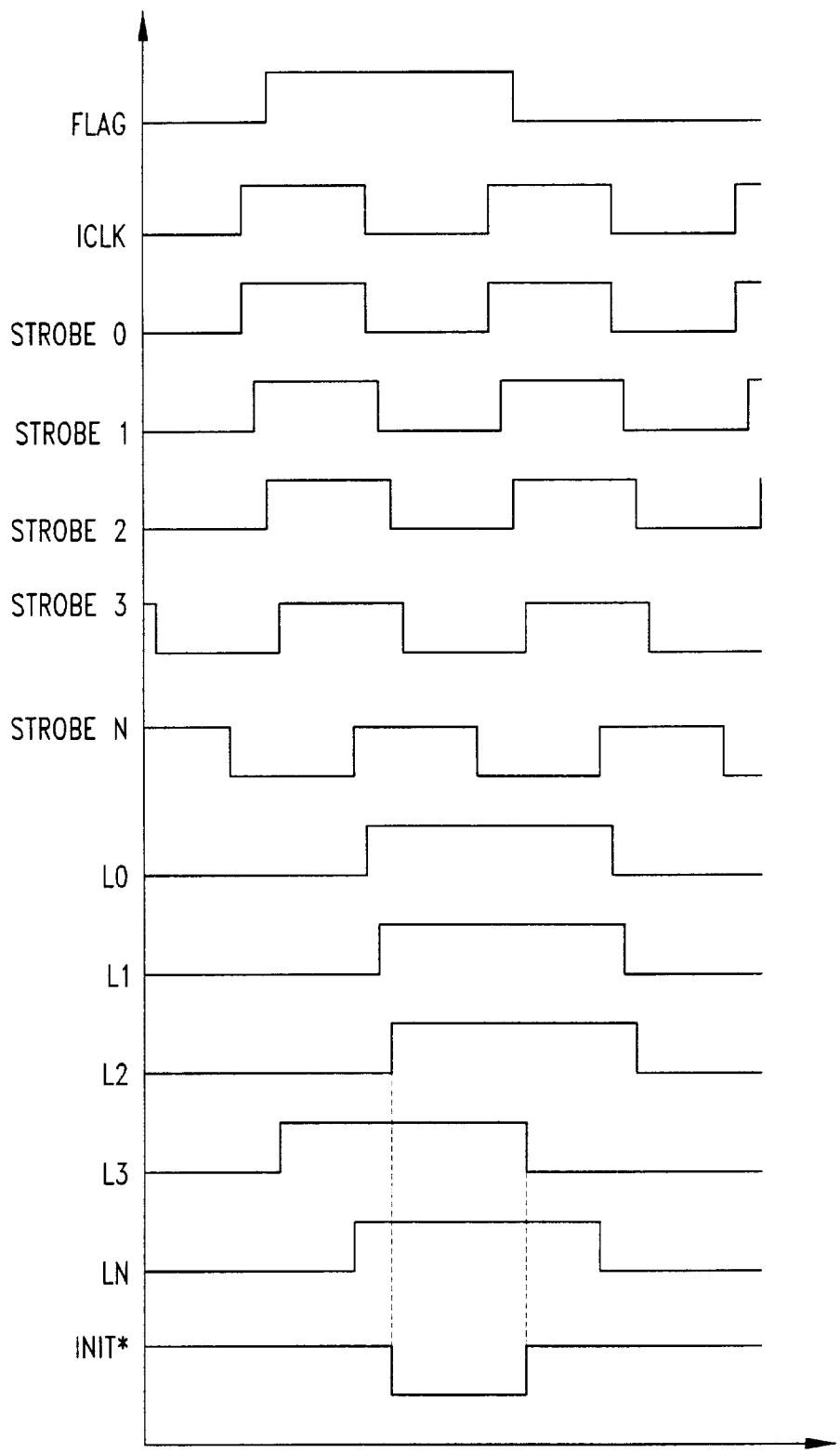
FIG. 18 is a timing diagram showing the operation of the Initialization Flag Detector of FIG. 17 upon receipt of an initialization FLAG signal.

The operation of the Initialization Flag Detector 330 will now the explained with reference to FIG. 18. As shown in the first line of FIG. 18, after the start of the initialization FLAG signal, the rising edge of each of the strobe signals STROBE 0—STROBE N clock a high into the respective latch 332a—332n starting with latch 332d and ending with latch 332c. Thus, during the period between when the output of the latch 332c goes high and the output of the latch 332d goes low, the outputs of all of the latches 332a–332n will all be high. The NAND gate 340 then generates the active low INIT* signal during this period to signify the detection of the initialization FLAG signal.

Figure 19:
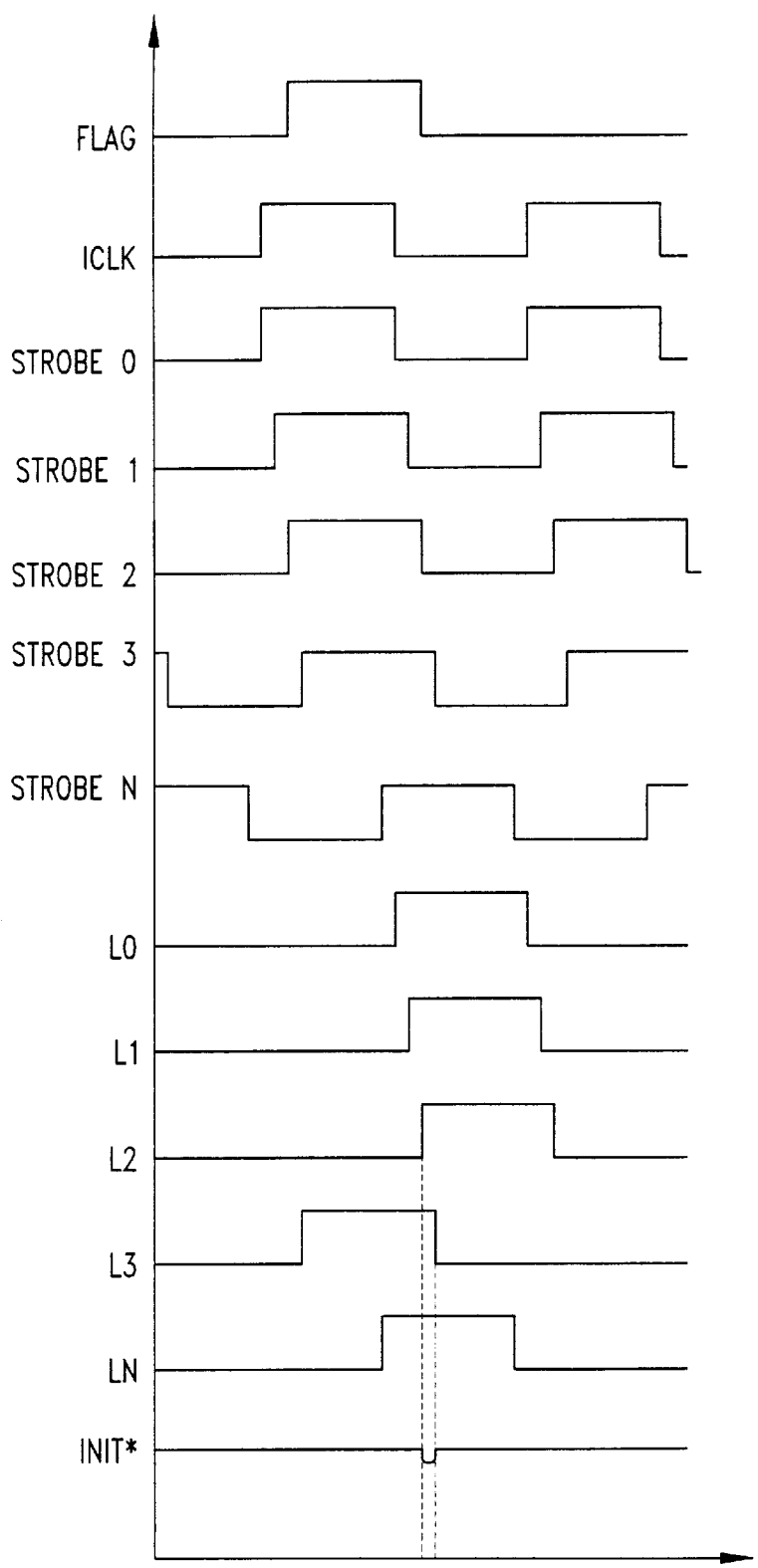
FIG. 19 is a timing diagram showing the operation of the Initialization Flag Detector of FIG. 17 upon receipt of a normal FLAG signal.

The operation of the Initialization Flag Detector 330 responsive to a normal FLAG signal is illustrated in FIG. 19. The first strobe signal occurring after the FLAG signal transitions high is again the STROBE 3 signal thereby, causing the output of the latch 332d to go high before the output of the other latches. As with the initialization FLAG signal, the last strobe signal to occur after the FLAG signal transitions high is the STROBE 2 signal, thereby causing the output of the latch 332c to go high after the outputs of all the other latches have transitioned high. However, because the normal FLAG signal has only half the duration of the initialization FLAG signal, the FLAG signal is high during only one transition of each strobe signal STROBE 0—STROBE N. As a result, by the time the high FLAG signal is clocked into the latch 332c, the FLAG signal is transitioning low, and this low is then clocked to the output of the latch 332d. The outputs of the latches 332a–332n are all high during the period between the output of the latch 332c going high and the output of the latch the 332c going low. However, this period is too short in duration for the NAND gate 340 to transition low. As a result, the INIT* signal at the output of the NAND gate 340 remains inactive high. Therefore, the Initialization Flag Detector 330 does not generate an active low INIT* signal in response to the normal FLAG signal.

Various modifications of an Initialization Flag Detector using latches are possible. For example, the latches 332 may be of the type that are clocked on either the rising edge or the falling edge (but not both edges) of the strobe signals, and the latches may store the strobed FLAG signal until they are subsequently reset by external circuitry (not shown). Under these circumstances, some of the latches will not be clocked when the normal FLAG signal is high. For example, using the timing relationships shown in FIG. 19, the latches 332a– c will not be clocked when the FLAG signal is high if the latches are clocked on the rising edge of their respective strobe signal. In contrast, all of the latches will be clocked when the initialization FLAG signal is high as can be seen with reference to FIG. 18, again assuming the latches are clocked on a rising edge of their respective strobe signals. Other variations, such as varying the number of latches and strobe signals used, are, of course, possible.

Figure 1:
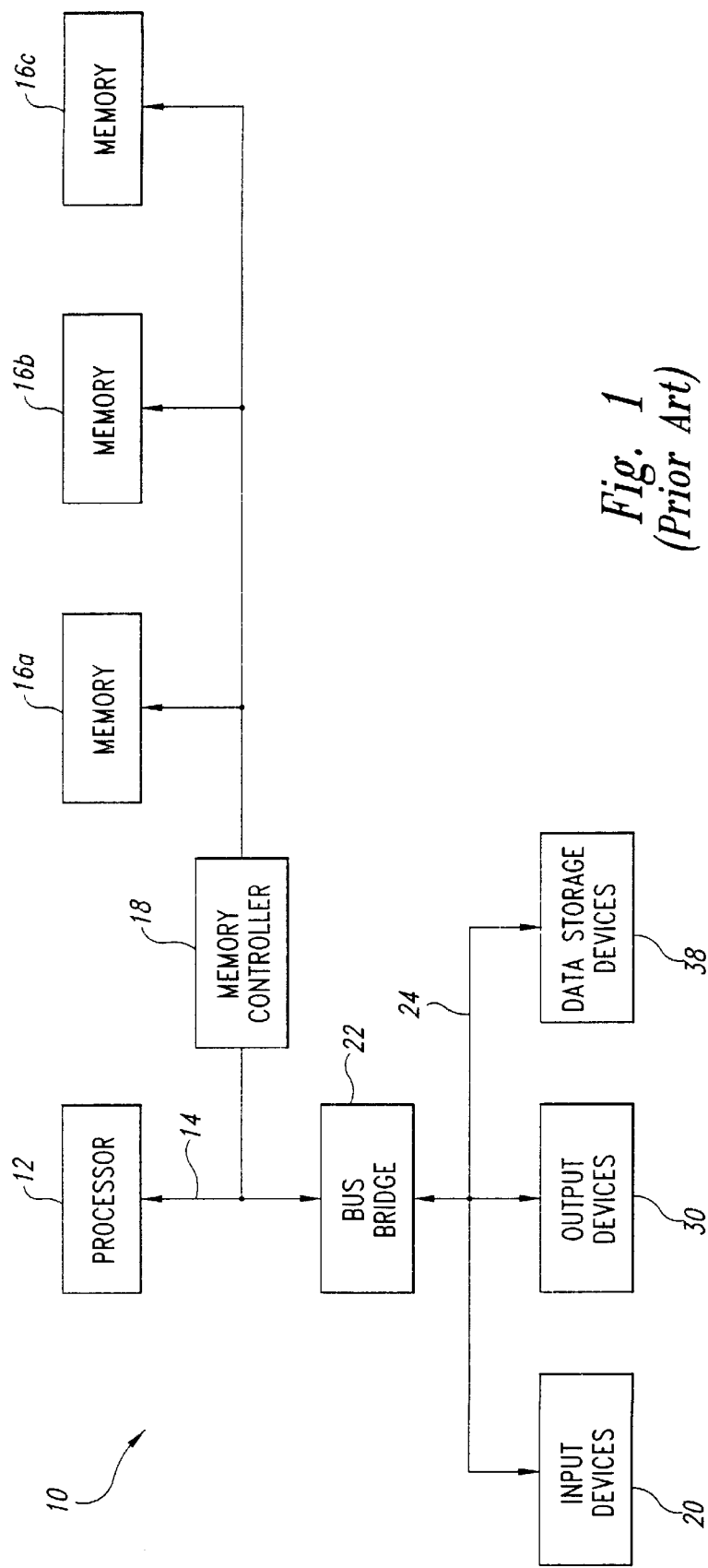
FIG. 1 is a block diagram of a conventional computer system using a plurality of SyncLink packetized memory devices.
Figure 2:
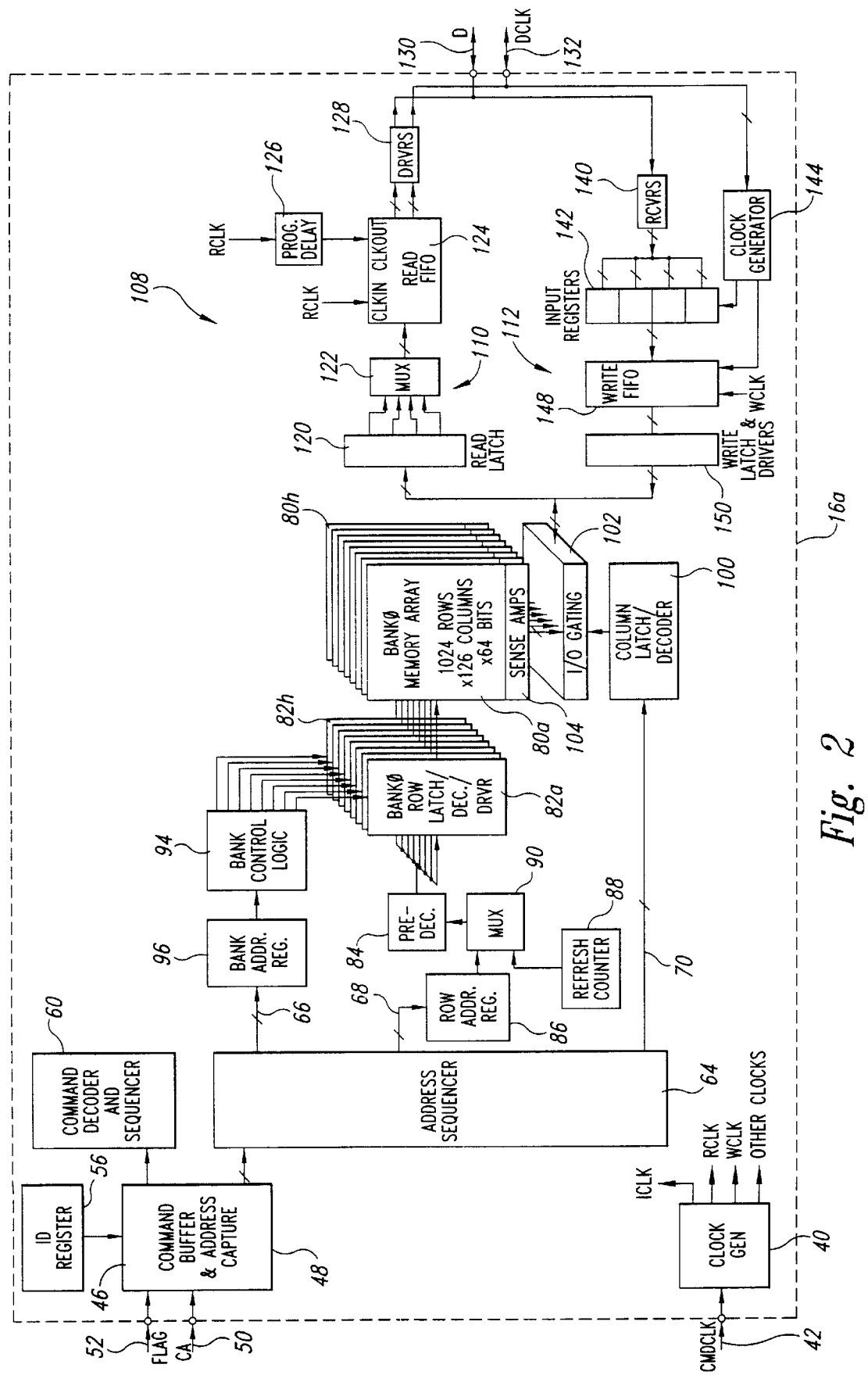
FIG. 2 is a block diagram of a conventional packetized DRAM used in the computer system of FIG. 1.

Sampling the FLAG signal at a rate sufficiently high that at least two samples are obtained when the FLAG signal is high can also be used for other purposes during initialization of the memory device. For example, during initialization, a predetermined pattern of signals are applied to the FLAG input line 52 (FIG. 2) and the command the bus 50. As described in greater detail in the application to Baker et al., Ser. No. 08/890,055, the memory device 16 attempts to capture this pattern of data for the purpose of configuring the memory device for optimum performance. However, it is difficult to sample the FLAG signal and packet words at the proper time during initialization because the phase of the ICLK signal, which clocks the FLAG signal and packet words, is not determined until completion of the initialization procedure. The FLAG signal and command packets can nevertheless be detected during initialization using the "oversampling" techniques described above for use in the Initialization Flag Detector.

Figure 20:
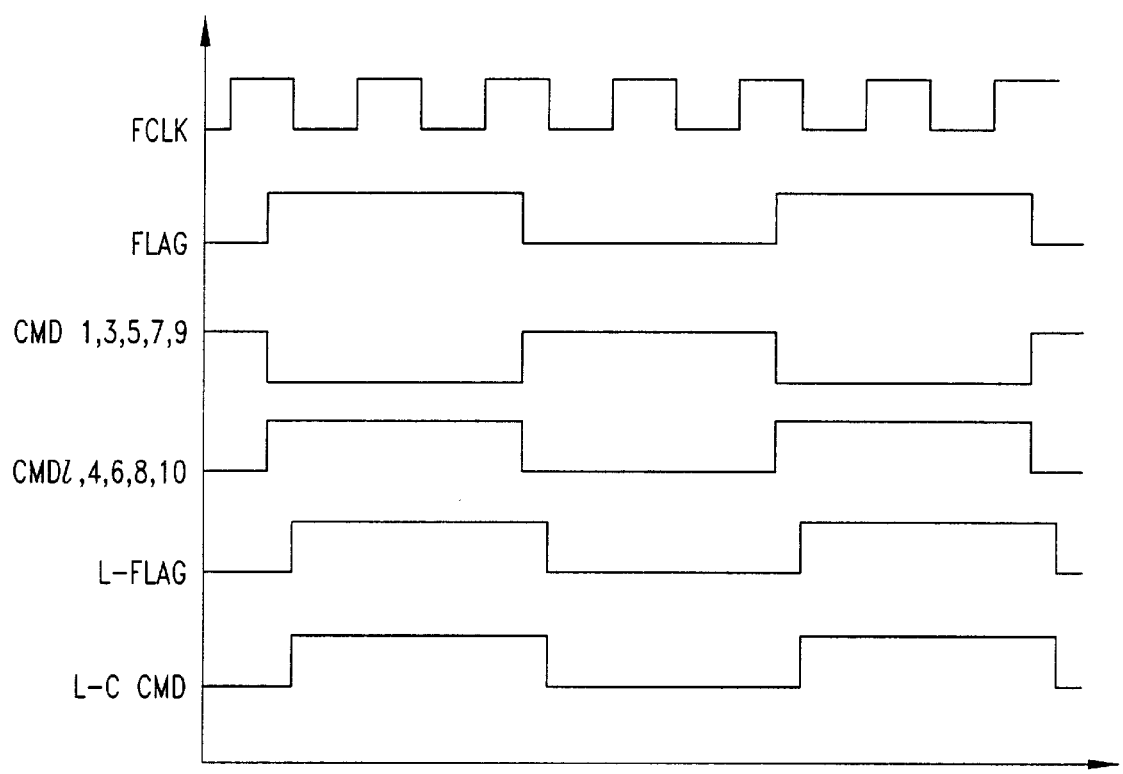
FIG. 20 is a timing diagram showing a pattern of signals that can be applied to the FLAG line and command bus during initialization and also showing the operation of an Error Detector Circuit shown in FIG. 21.

One pattern of the FLAG signal and packet words that can be used during initialization is illustrated in FIG. 20. As shown therein, the FLAG signal alternates between low and high logic levels, the even bits of the packet word are driven with the same logic level as the FLAG signal, and the odd bits of the packet word are driven with the complementary logic level of the FLAG signal.

Figure 21:
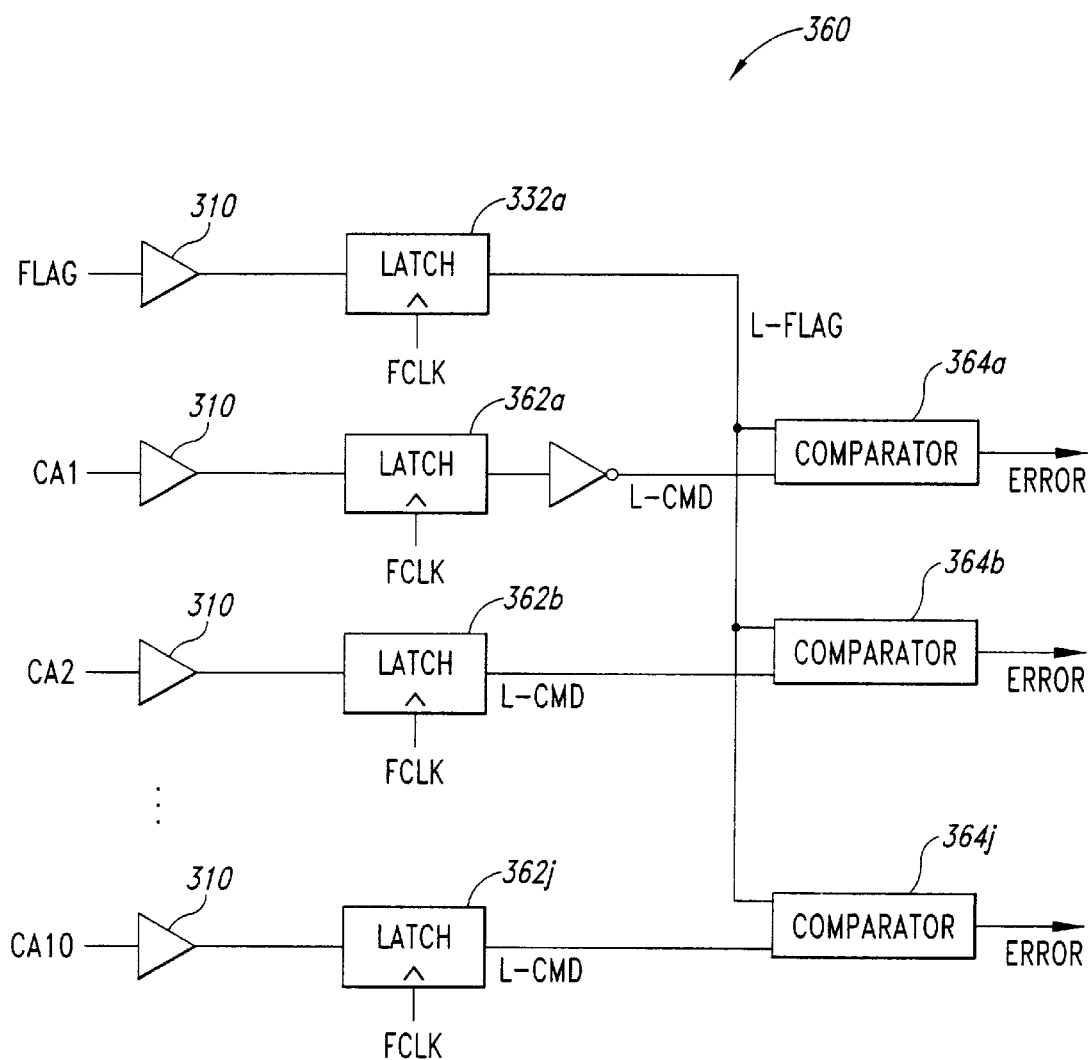
FIG. 21 is a block diagram of one embodiment of an Error Detection Circuit that may be used in the command buffer of FIG. 9.

One embodiment of an Error Detection Circuit 360 using the above-described oversampling technique is illustrated in FIG. 21. The Error Detection Circuit 360 may be used in the command buffer of FIG. 9, and the resulting command buffer may be used in the memory device 16 of FIG. 2. The components of the Error Detection Circuit 360 are primarily the same components used in the Initialization Flag Detector 330 of FIG. 17, and these components have therefore been provided with the same reference numerals. Since these components operate in the same manner as described above, a description of their operation will not be repeated in the interest of brevity. The only additional components used in the Error Detection Circuit 360 are 10 buffers 310, 10 latches 362a–362j, which are the same as the latches 332a–332n, 10 comparitors 364a–360j, and 5 inverters 366a–366e. The latches 362 a–36j each receive a respective bit of the packet word through a respective buffer 310, and the comparitors 364a–364j receive the output of the latch 332a at one input and the output of a respective latch 362a–362j at their other input. The output of the latches 362 for the odd bits of the packet word are coupled to their respective comparitors 364 through respective inverters 366a–366e.

Returning, now, to FIG. 20, the operation of the Error Detection Circuit 360 will now be explained. If the FLAG signal and all 10 bits of the packet word are properly detected in the memory device 16a, the signals provided to each of the comparitors 364 will be the same. However, if either the FLAG signal or any of the 10 bits of the packet word are improperly detected in the memory device 16a, then its corresponding comparitor 364 will generate an ERROR signal. This ERROR signal is detected by other circuitry (not shown) that receives the outputs of all of the comparitors 364. The comparitors 364 may be implemented by various circuitry, such as by exclusive OR gates (not shown).

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. In a packetized dynamic random access memory ("DRAM"), a method of detecting an initialization flag signal applied to a flag input terminal of the DRAM having a duration that is longer than the duration of a normal flag signal applied to the flag input terminal of the DRAM, the method comprising:

sampling signals applied to the flag input terminal of the DRAM to obtain a plurality of samples during the duration of the initialization flag signal;

determining the number of contiguous samples corresponding to a predetermined logic level; and determining if the number of contiguous samples corresponding to the predetermined logic level were taken over a duration that is longer than the duration of the normal flag signal.

2. The method of claim 1 wherein the duration of the initialization flag signal is twice the duration of the normal flag signal.

3. The method of claim 1 wherein the predetermined logic level corresponds to the logic level of the initialization flag signal.

4. The method of claim 1 wherein the act of sampling signals applied to the flag input terminal of the DRAM comprises:

receiving a command clock signal applied to the DRAM from an external source;

deriving a strobe signal from the command clock signal, the strobe signal having a frequency that is at least twice the frequency of the command clock signal; and using the strobe signal to sample signals applied to the flag input terminal of the DRAM.

5. The method of claim 1 wherein the act of using the strobe signal to sample signals applied to the flag input terminal of the DRAM comprises sampling signals applied to the flag input terminal of the DRAM on each transition of the strobe signal.

6. The method of claim 1, wherein the act of sampling signals applied to the flag input terminal of the DRAM comprises sampling signals applied to the flag input terminal of the DRAM at a rate that is sufficiently high that at least four samples are taken during the duration of the initialization flag signal.

7. The method of claim 1 wherein the packetized DRAM is further adapted to receive a command packet applied to a command bus, the command packet and a flag signal applied to the flag input terminal of the DRAM having predetermined patterns during initialization of the DRAM, and wherein the method further includes a method of detecting an error in the command packet as received by the DRAM, the method comprising:

sampling the command bus at a rate that is sufficiently high that a plurality of samples are taken during the duration of the initialization flag signal;

comparing the samples of the command bus to the samples of the flag signal applied to the flag input terminal of the DRAM, and on the basis of comparison determining if the signals applied to the flag input terminal of the DRAM do not correspond to bits of the command packet applied to the command bus of the DRAM.

8. The method of claim 7, wherein the act of sampling the command bus comprises sampling the command bus at the same rate that the signals applied to the flag input terminal of the DRAM are sampled.

9. The method of claim 8, wherein the act of sampling the command bus at the same rate that the signals applied to the flag input terminal of the DRAM are sampled comprises sampling the command bus and the signals applied to the flag input terminal of the DRAM at substantially the same times.

10. In a packetized dynamic random access memory ("DRAM") receiving a command packet applied to a command bus, a normal flag signal and an initialization flag signal applied to a flag terminal, and a command clock signal applied to a command clock terminal, the command clock signal having an unknown phase relative to the phase of the initialization flag signal, the normal flag signal signifying the start of a command packet and the initialization flag signal signifying an initialization mode, the initialization flag signal having a duration that is longer than the duration of a normal flag signal and a logic level that is equal to the logic level of the normal flag signal, a method of detecting the initialization flag signal comprising:

deriving a strobe signal from the from the command clock signal;

using the strobe signal to sample a flag signal applied to the flag terminal of the DRAM, the strobe signal having a frequency selected so that a plurality of samples are taken during the duration of an initialization flag signal;

determining the number of contiguous samples corresponding to the logic level of the flag signal applied to the flag terminal; and determining if the number of contiguous samples corresponding to the logic level of the flag signal applied to the flag terminal were taken over a duration that is longer than the duration of a normal flag signal.

11. The method of claim 10 wherein the duration of the initialization flag signal is twice the duration of the normal flag signal.

12. The method of claim 10 wherein the act of using the strobe signal to sample the initialization flag signal and the normal flag signal comprises sampling the initialization flag signal and the normal flag signal on each transition of the strobe signal.

13. The method of claim 10, wherein the strobe signal has a frequency that is sufficiently high that at least four samples are taken during the duration of the initialization flag signal.

14. The method of claim 10, wherein the command packet and a flag signal applied to the flag terminal of the DRAM have predetermined patterns during initialization of the DRAM, and wherein the method further includes a method of detecting an error in the command packet as received by the DRAM comprising:

sampling the command bus at a rate that is sufficiently high that a plurality of samples are taken during the duration of the initialization flag signal;

comparing the samples of the command bus to the samples of the flag signal applied to the flag terminal of the DRAM, and on the basis of comparison, determining if the signals applied to the flag terminal of the DRAM do not correspond to bits of the command packet applied to the command bus of the DRAM.

15. The method of claim 14, wherein the act of sampling the command bus comprises sampling the command bus at the same rate that the flag signal applied to the flag terminal of the DRAM is sampled.

16. The method of claim 15, wherein the act of sampling the command bus at the same rate that the flag signal applied to the flag terminal of the DRAM is sampled comprises sampling the command bus and the flag signals applied to the flag terminal of the DRAM at substantially the same times.

17. A method of detecting an error in a command packet applied to a command bus of a packetized DRAM, the DRAM receiving a flag signal applied to a flag terminal of the DRAM, the command packet and the flag signal having predetermined patterns during initialization of the DRAM, the method comprising:

sampling the flag terminal at a rate selected so that a plurality of samples are taken during the duration of the flag signal;

sampling the command bus at a rate selected so that a plurality of samples are taken during the duration of the flag signal;

comparing the samples of the command bus to the samples of the flag signal applied to the flag terminal of the DRAM, and on the basis of comparison, determining if the signals applied to the flag terminal of the DRAM do not correspond to bits of the command packet applied to the command bus of the DRAM.

18. The method of claim 17 wherein the acts of sampling the flag signal and the command bus comprise:

receiving a command clock signal applied to the DRAM from an external source;

deriving a strobe signal from the command clock signal, the strobe signal having a frequency that is at least twice the frequency of the command clock signal; and using the strobe signal to sample the flag signal and the command bus.

19. The method of claim 18 wherein the act of using the strobe signal to sample the flag signal and the command bus comprises sampling the flag signal and the command bus on each transition of the strobe signal.

20. The method of claim 17 wherein the act of sampling the command bus comprises sampling the command bus at the same rate that the flag signal is sampled.

21. The method of claim 20, wherein the act of sampling the command bus at the same rate that the flag signal is sampled comprises sampling the command bus and the flag signal at substantially the same times.

22. The method of claim 20, wherein the act of sampling the flag terminal comprises sampling the flag terminal at a rate that is sufficiently high that at least four samples are taken during the duration of the flag signal.

23. A system for detecting an initialization flag signal applied to a flag input terminal, the initialization flag signal having a duration that is longer than the duration of a normal flag signal applied to the flag input terminal, the system comprising:

a clock generator receiving an externally applied command clock signal and generating at least one strobe signal from the command clock signal;

a flag sampling circuit having a data input coupled to the flag input terminal and a clock terminal coupled to the clock generator to receive the at least one strobe signal, the flag sampling circuit obtaining samples at a rate so that a plurality of samples are taken during the duration of the initialization flag signal; and a logic circuit coupled to the flag sampling circuit to receive the samples from the flag sampling circuit, the logic circuit comparing a plurality of the samples to each other and generating an initialization flag detect signal in the event a predetermined number of the samples corresponding to a predetermined logic level are consecutively obtained over a duration that is longer than the duration of the normal flag signal.

24. The system of claim 23 wherein the duration of the initialization flag signal is twice the duration of the normal flag signal.

25. The system of claim 23 wherein the flag sampling circuit comprises a shift register having a data input terminal coupled to the flag input terminal, a clock terminal coupled to the clock generator to receive the strobe signal, and an output terminal for each stage of the shift register coupled to the logic circuit.

26. The system of claim 23 wherein the clock generator comprises a quadrature generator circuit generating a first strobe signal corresponding to the command clock signal and a second strobe signal having a phase that differs from the phase of the first strobe signal by 90 degrees, and wherein the flag sampling circuit comprises:

a first shift register having a data input terminal coupled to the flag input terminal, a clock terminal coupled to the clock generator to receive the first strobe signal, and an output terminal for each stage of the shift register coupled to the logic circuit; and a second shift register having a data input terminal coupled to the flag input terminal a clock terminal coupled to the clock generator to receive the second strobe signal, and an output terminal for each stage of the shift register coupled to the logic circuit.

27. The system of claim 23 wherein the logic circuit comprises a NAND gate.

28. The system of claim 23 wherein the flag sampling circuit obtains samples at a rate that is sufficiently high that at least four samples are taken during the duration of the initialization flag signal.

29. The system of claim 23 wherein the clock generator comprises a clock phase shifter circuit generating a plurality of strobe signals corresponding in frequency to the frequency of the command clock signal and having phases relative to the phase of the phase of the command clock signal that differ from each other, and wherein the flag sampling circuit comprises a plurality of latches each having a data input terminal coupled to the flag input terminal, a clock terminal coupled to the clock phase shifter circuit to receive a respective one of the strobe signals, and a data output terminal operable to couple a signal stored in the latch to the logic circuit the latches being operable to store the signal coupled to the data input terminals of the latches at a time determined by the respective strobe signal applied to each of the latches.

30. The system of claim 23 wherein the packetized DRAM is further adapted to receive a command packet applied to a command bus, the command packet and a flag signal applied to the flag input terminal of the DRAM having predetermined patterns during initialization of the DRAM, and wherein the system further includes a detection circuit for detecting an error in the command packet as received by the DRAM, the detection circuit comprising:

a command packet sampling circuit having a data input coupled to the command bus and a clock terminal coupled to the clock generator to receive the at least one strobe signal, the sampling circuit being operable to obtain samples at a rate that is sufficiently high that a plurality of samples are taken during the duration of the initialization flag signal; and a comparator circuit operable to compare the samples of the command bus to the samples of the flag signal applied to the flag input terminal of the DRAM and to generate an error signal in the event the samples do not correspond to each other.

31. The system of claim 30 wherein the command packet sampling circuit is operable to sample the command bus at the same rate that the flag sampling circuit samples the flag signal applied to the flag input terminal of the DRAM.

32. The system of claim 30 wherein the command packet sampling circuit is operable to sample the command bus at substantially the same times that the flag sampling circuit samples the flag signal applied to the flag input terminal of the DRAM.

33. The system of claim 30 wherein:

the flag sampling circuit comprises a latch having a data input terminal coupled to the flag input terminal, a clock terminal coupled to the clock generator to receive the at least one strobe signal, and a data output terminal operable to couple a signal stored in the latch to the comparator, the latch being operable to store the signal coupled to the data input terminal of the latch at a time determined by the strobe signal applied to the latch; and wherein the command packet sampling circuit comprises a plurality of latches each having a data input terminal coupled to a respective bit of the command bus, a clock terminal coupled to the clock generator to receive the at least one strobe signal, and a data output terminal operable to couple a signal stored in the latch to the comparator, the latches being operable to store the signal coupled to the data input terminals of the latches at a time determined by the strobe signal applied to the latches.

34. A system for detecting an error in a command packet applied to a command bus of a packetized DRAM, the DRAM receiving a flag signal applied to a flag terminal of the DRAM, the command packet and the flag signal having predetermined patterns during initialization of the DRAM, the system comprising;

a clock generator receiving an externally applied command clock signal and generating at least one strobe signal from the command clock signal;

a first sampling circuit having a data input coupled to the flag input terminal and a clock terminal coupled to the clock generator to receive the at least one strobe signal, the first sampling circuit obtaining samples of the flag signal at a rate causing a plurality of samples to be taken during the duration of the flag signal; and a second sampling circuit having a data input coupled to the command bus and a clock terminal coupled to the clock generator to receive the at least one strobe signal, the sampling circuit obtaining samples of the command packet at a rate causing a plurality of samples to be taken during the duration of the flag signal;

a comparator circuit coupled to the first and second sampling circuits, the comparator circuit comparing the samples of the command packet to the samples of the flag signal and generating an error signal in the event the samples do not correspond to each other.

35. The error detecting system of claim 34 wherein the second sampling circuit is operable to sample the command bus at the same rate that the first sampling circuit samples the flag input terminal of the DRAM.

36. The error detecting system of claim 34 wherein the command packet sampling circuit is operable to sample the command bus at substantially the same times that the sampling circuit samples the flag input terminal of the DRAM.

37. The error detecting system of claim 34 wherein:
the first sampling circuit comprises a latch having a data input terminal coupled to the flag input terminal, a clock terminal coupled to the clock generator to receive the at least one strobe signal, and a data output terminal operable to couple a signal stored in the latch to the comparator, the latch being operable to store the signal coupled to the data input terminal of the latch at a time determined by the strobe signal applied to the latch; and
wherein the second sampling circuit comprises a plurality of latches each having a data input terminal coupled to a respective bit of the command bus, a clock terminal coupled to the clock generator to receive the at least one strobe signal and a data output terminal operable to couple a signal stored in the latch to the comparator, the latches being operable to store the signal coupled to the data input terminals of the latches at a time determined by the strobe signal applied to the latches.

38. A command buffer receiving command packets applied to a command bus, a command clock signal applied to a clock input terminal, and a normal flag signal and an initialization flag signal applied to a flag input terminal, the initialization flag signal having a duration that is longer than the duration of the normal flag signal, the command buffer comprising:
a clock generator circuit coupled to the clock input terminal to receive the command clock signal, the clock generator circuit generating an internal clock signal that may have a phase that differs from the phase of the command clock signal, the clock generator circuit further generating at least one strobe signal from the command clock signal;
a latch coupled to the command bus to receive the command packets and coupled to the clock generator circuit to receive the internal clock signal, the latch storing each of the received packets responsive to a transition of the internal clock signal, the command buffer further generating respective command words corresponding to each received command packet;
an initialization flag detector coupled to the flag input terminal to receive the initialization flag signal and the normal flag signal, the initialization flag detector comprising:
a flag sampling circuit having a data input coupled to the flag input terminal and a clock terminal coupled to the clock generator circuit to receive the at least one strobe signal, the flag sampling circuit obtaining samples at a rate so that that a plurality of samples are taken during the duration of the initialization flag signal; and
a logic circuit coupled to the flag sampling circuit to receive the samples from the flag sampling circuit, the logic circuit comparing a plurality of the samples to each other and generating an initialization flag detect signal in the event a predetermined number of the samples corresponding to a predetermined logic level are consecutively obtained over a duration that is longer than the duration of the normal flag signal;
a second shift register having a data input terminal coupled to the flag input terminal, a clock terminal coupled to the clock generator to receive the second strobe signal, and an output terminal for each stage of the shift register coupled to the logic circuit.

39. The command buffer of claim 38 wherein the duration of the initialization flag signal is twice the duration of the normal flag signal.

40. The command buffer of claim 38 wherein the flag sampling circuit comprises a shift register having a data input terminal coupled to the flag input terminal, a clock terminal coupled to the clock generator to receive the strobe signal, and an output terminal for each stage of the shift register coupled to the logic circuit.

41. The command buffer of claim 38 wherein the clock generator comprises a quadrature generator circuit generating a first strobe signal corresponding to the command clock signal and a second strobe signal having a phase that differs from the phase of the first strobe signal by 90 degrees, and wherein the flag sampling circuit comprises:
a first shift register having a data input terminal coupled to the flag input terminal, a clock terminal coupled to the clock generator to receive the first strobe signal and an output terminal for each stage of the shift register coupled to the logic circuit; and
a second shift register having a data input terminal coupled to the flag input terminal, a clock terminal coupled to the clock generator to receive the second strobe signal, and an output terminal for each stage of the shift register coupled to the logic circuit.

42. The command buffer of claim 38 wherein the logic circuit comprises a NAND gate.

43. The command buffer of claim 38 wherein the flag sampling circuit obtains samples at a rate that is sufficiently high that at least four samples are taken during the duration of the initialization flag signal.

44. The command buffer of claim 38 wherein the clock generator comprises a clock phase shifter circuit generating a plurality of strobe signals corresponding in frequency to the frequency of the command clock signal and having phases relative to the phase of the phase of the command clock signal that differ from each other, and wherein the flag sampling circuit comprises a plurality of latches each having a data input terminal coupled to the flag input terminal a clock terminal coupled to the clock phase shifter circuit to receive a respective one of the strobe signals and a data output terminal operable to couple a signal stored in the latch to the logic circuit, the latches being operable to store the signal coupled to the data input terminals of the latches at a time determined by the respective strobe signal applied to each of the latches.

45. The command buffer of claim 38 wherein the packetized DRAM is further adapted to receive a command packet applied to a command bus, the command packet and a flag signal applied to the flag input terminal of the DRAM having predetermined patterns during initialization of the DRAM, and wherein the system further includes a detection circuit for detecting an error in the command packet as received by the DRAM, the detection circuit comprising:
a command packet sampling circuit having a data input coupled to the command bus and a clock terminal coupled to the clock generator to receive the at least one strobe signal, the command packet sampling circuit being operable to obtain samples at a rate that is sufficiently high that a plurality of samples are taken during the duration of the initialization flag signal; and
a comparator circuit operable to compare the samples of the command bus to the samples of the flag signal applied to the flag input terminal of the DRAM.

46. The command buffer of claim 45 wherein the command packet sampling circuit is operable to sample the command bus at the same rate that the flag sampling circuit samples the flag signal applied to the flag input terminal of the DRAM.

47. The command buffer of claim 45 wherein the command packet sampling circuit is operable to sample the command bus at substantially the same times that the flag sampling circuit samples the flag signal applied to the flag input terminal of the DRAM.

48. A packetized dynamic random access memory ("DRAM"), comprising:
   a clock generator circuit receiving a command clock signal and generating an internal clock signal from the command clock signal that may have a phase that differs from the phase of the command clock signal, the clock generator circuit further generating at least one strobe signal from the command clock signal;
   at least one array of memory cells storing data at a location determined by a row address and a column address;
   a row address circuit receiving and decoding the row address, and select a row of memory cells corresponding to the row address responsive to a first set of command signals;
   a column address circuit receiving or applying data to one of the memory cells in the selected row corresponding to the column address responsive to a second set of command signals;
   a data path circuit coupling data between an external terminal and the column address circuit responsive to a third set of command signals;
   a command buffer receiving command packets applied to a command bus, and a normal flag signal and an initialization flag signal applied to a flag input terminal, the initialization flag signal having a duration that is longer than the duration of the normal flag signal, the command buffer comprising:
      a latch coupled to the command bus to receive the command packets and coupled to the clock generator circuit to receive the internal clock signal, the latch storing each of the received packets responsive to a transition of the internal clock signal, the command buffer further generating respective command words corresponding to each received command packet;
      an initialization flag detector coupled to the flag input terminal to receive the initialization flag signal and the normal flag signal, the initialization flag detector comprising:
         a flag sampling circuit having a data input coupled to the flag input terminal and a clock terminal coupled to the clock generator circuit to receive the at least one strobe signal, the flag sampling circuit obtaining samples at a rate causing a plurality of samples to be taken during the duration of the initialization flag signal; and
         a logic circuit coupled to the flag sampling circuit to receive the samples from the flag sampling circuit, the logic circuit comparing a plurality of the samples to each other and generating an initialization flag detect signal in the event a predetermined number of the samples corresponding to a predetermined logic level are consecutively obtained over a duration that is longer than the duration of the normal flag signal.

49. The packetized ("DRAM") of claim 48 wherein the duration of the initialization flag signal is twice the duration of the normal flag signal.

50. The packetized ("DRAM") of claim 48 wherein the flag sampling circuit comprises a shift register having a data input terminal coupled to the flag input terminal, a clock terminal coupled to the clock generator to receive the strobe signal, and an output terminal for each stage of the shift register coupled to the logic circuit.

51. The packetized ("DRAM") of claim 48 wherein the clock generator comprises a quadrature generator circuit generating a first strobe signal corresponding to the command clock signal and a second strobe signal having a phase that differs from the phase of the first strobe signal by 90 degrees, and wherein the flag sampling circuit comprises:
   a first shift register having a data input terminal coupled to the flag input terminal, a clock terminal coupled to the clock generator to receive the first strobe signal and an output terminal for each stage of the shift register coupled to the logic circuit; and
   a second shift register having a data input terminal coupled to the flag input terminal, a clock terminal coupled to the clock generator to receive the second strobe signal, and an output terminal for each stage of the shift register coupled to the logic circuit.

52. The packetized ("DRAM") of claim 48 wherein the logic circuit comprises a NAND gate.

53. The packetized ("DRAM") of claim 48 wherein the flag sampling circuit obtains samples at a rate that is sufficiently high that at least four samples are taken during the duration of the initialization flag signal.

54. The packetized ("DRAM") of claim 48 wherein the clock generator comprises a clock phase shifter circuit generating a plurality of strobe signals corresponding in frequency to the frequency of the command clock signal and having phases relative to the phase of the phase of the command clock signal that differ from each other, and wherein the flag sampling circuit comprises a plurality of latches each having a data input terminal coupled to the flag input terminal, a clock terminal coupled to the clock phase shifter circuit to receive a respective one of the strobe signals, and a data output terminal operable to couple a signal stored in the latch to the logic circuit, the latches being operable to store the signal coupled to the data input terminals of the latches at a time determined by the respective strobe signal applied to each of the latches.

55. The packetized ("DRAM") of claim 48 wherein the packetized DRAM is further adapted to receive a command packet applied to a command bus, the command packet and a flag signal applied to the flag input terminal of the DRAM having predetermined patterns during initialization of the DRAM, and wherein the system further includes a detection circuit for detecting an error in the command packet as received by the DRAM, the detection circuit comprising:
   a command packet sampling circuit having a data input coupled to the command bus and a clock terminal coupled to the clock generator to receive the at least one strobe signal, the command packet sampling circuit being operable to obtain samples at a rate that is sufficiently high that a plurality of samples are taken during the duration of the initialization flag signal; and
   a comparator circuit operable to compare the samples of the command bus to the samples of the flag signal applied to the flag input terminal of the DRAM.

56. The packetized ("DRAM") of claim 55 wherein the command packet sampling circuit is operable to sample the command bus at the same rate that the flag sampling circuit samples the flag signal applied to the flag input terminal of the DRAM.

57. The packetized ("DRAM") of claim 55 wherein the command packet sampling circuit is operable to sample the command bus at substantially the same times that the flag sampling circuit samples the flag signal applied to the flag input terminal of the DRAM.

58. A packetized dynamic random access memory ("DRAM"), comprising:
   a clock generator circuit receiving a command clock signal and generating an internal clock signal from the command clock signal that may have a phase that differs from the phase of the command clock signal, the clock generator circuit further generating at least one strobe signal from the command clock signal;
   at least one array of memory cells storing data at a location determined by a row address and a column address;
   a row address circuit receiving and decoding the row address, and select a row of memory cells corresponding to the row address responsive to a first set of command signals;
   a column address circuit receiving or applying data to one of the memory cells in the selected row corresponding to the column address responsive to a second set of command signals;
   a data path circuit coupling data between an external terminal and the column address circuit responsive to a third set of command signals;
   a command buffer receiving command packets applied to a command bus, and a normal flag signal and an initialization flag signal applied to a flag input terminal, the initialization flag signal having a duration that is longer than the duration of the normal flag signal, the command buffer comprising:
      a latch coupled to the command bus to receive the command packets and coupled to the clock generator circuit to receive the internal clock signal, the latch storing each of the received packets responsive to a transition of the internal clock signal, the command buffer further generating respective command words corresponding to each received command packet;
      a circuit for detecting an error in a command packet applied to a command bus of a packetized DRAM, the DRAM receiving a flag signal applied to a flag terminal of the DRAM, the command packet and the flag signal having predetermined patterns during initialization of the DRAM, the error detecting circuit comprising:
         a first sampling circuit having a data input coupled to the flag input terminal and a clock terminal coupled to the clock generator to receive the at least one strobe signal, the first sampling circuit obtaining samples of the flag signal at a rate causing a plurality of samples to be taken during the duration of the flag signal;
         a second sampling circuit having a data input coupled to the command bus and a clock terminal coupled to the clock generator to receive the at least one strobe signal, the sampling circuit obtaining samples of the command packet at a rate causing a plurality of samples to be taken during the duration of the flag signal; and
         a comparator circuit coupled to the first and second sampling circuits, the comparator circuit comparing the samples of the command packet to the samples of the flag signal and to generate an error signal in the event the samples do not correspond to each other.

59. The packetized ("DRAM") of claim 58 wherein the second sampling circuit is operable to sample the command bus at the same rate that the first sampling circuit samples the flag input terminal of the DRAM.

60. The packetized ("DRAM") of claim 58 wherein the command packet sampling circuit is operable to sample the command bus at substantially the same times that the sampling circuit samples the flag input terminal of the DRAM.

61. The packetized ("DRAM") of claim 58 wherein:
   the first sampling circuit comprises a latch having a data input terminal coupled to the flag input terminal, a clock terminal coupled to the clock generator to receive the at least one strobe signal, and a data output terminal operable to couple a signal stored in the latch to the comparator, the latch being operable to store the signal coupled to the data input terminal of the latch at a time determined by the strobe signal applied to the latch; and
   wherein the second sampling circuit comprises a plurality of latches each having a data input terminal coupled to a respective bit of the command bus, a clock terminal coupled to the clock generator to receive the at least one strobe signal, and a data output terminal operable to couple a signal stored in the latch to the comparator, the latches being operable to store the signal coupled to the data input terminals of the latches at a time determined by the strobe signal applied to the latches.

62. A computer system, comprising:
   a processor having a processor bus;
   an input device coupled to the processor through the processor bus to allow data to be entered into the computer system;
   an output device coupled to the processor through the processor bus to allow data to be output from the computer system; and
   a packetized dynamic random access memory coupled to the processor bus, comprising:
      a clock generator circuit receiving a command clock signal and generating an internal clock signal from the command clock signal that may have a phase that differs from the phase of the command clock signal, the clock generator circuit further generating at least one strobe signal from the command clock signal;
      at least one array of memory cells storing data at a location determined by a row address and a column address;
      a row address circuit receiving and decoding the row address, and select a row of memory cells corresponding to the row address responsive to a first set of command signals;
      a column address circuit receiving or applying data to one of the memory cells in the selected row corresponding to the column address responsive to a second set of command signals;
      a data path circuit coupling data between an external terminal and the column address circuit responsive to a third set of command signals;
      a command buffer receiving command packets applied to a command bus, and a normal flag signal and an initialization flag signal applied to a flag input terminal, the initialization flag signal having a duration that is longer than the duration of the normal flag signal, the command buffer comprising:
         a latch coupled to the command bus to receive the command packets and coupled to the clock generator circuit to receive the internal clock signal, the latch storing each of the received packets responsive to a transition of the internal clock signal, the command buffer further generating respective command words corresponding to each received command packet;

an initialization flag detector coupled to the flag input terminal to receive the initialization flag signal and the normal flag signal, the initialization flag detector comprising:

a flag sampling circuit having a data input coupled to the flag input terminal and a clock terminal coupled to the clock generator circuit to receive the at least one strobe signal, the flag sampling circuit obtaining samples at a rate causing a plurality of samples to be taken during the duration of the initialization flag signal; and a logic circuit coupled to the flag sampling circuit to receive the samples from the flag sampling circuit, the logic circuit comparing a plurality of the samples to each other and generating an initialization flag detect signal in the event a predetermined number of the samples corresponding to a predetermined logic level are consecutively obtained over a duration that is longer than the duration of the normal flag signal.

63. The computer system of claim 62 wherein the duration of the initialization flag signal is twice the duration of the normal flag signal.

64. The computer system of claim 62 wherein the flag sampling circuit comprises a shift register having a data input terminal coupled to the flag input terminal, a clock terminal coupled to the clock generator to receive the strobe signal and an output terminal for each stage of the shift register coupled to the logic circuit.

65. The computer system of claim 62 wherein the clock generator comprises a quadrature generator circuit generating a first strobe signal corresponding to the command clock signal and a second strobe signal having a phase that differs from the phase of the first strobe signal by 90 degrees, and wherein the flag sampling circuit comprises:

a first shift register having a data input terminal coupled to the flag input terminal, a clock terminal coupled to the clock generator to receive the first strobe signal, and an output terminal for each stage of the shift register coupled to the logic circuit; and a second shift register having a data input terminal coupled to the flag input terminal, a clock terminal coupled to the clock generator to receive the second strobe signal, and an output terminal for each stage of the shift register coupled to the logic circuit.

66. The computer system of claim 62 wherein the logic circuit comprises a NAND gate.

67. The computer system of claim 62 wherein the flag sampling circuit obtains samples at a rate that is sufficiently high that at least four samples are taken during the duration of the initialization flag signal.

68. The computer system of claim 62 wherein the clock generator comprises a clock phase shifter circuit generating a plurality of strobe signals corresponding in frequency to the frequency of the command clock signal and having phases relative to the phase of the phase of the command clock signal that differ from each other, and wherein the flag sampling circuit comprises a plurality of latches each having a data input terminal coupled to the flag input terminal a clock terminal coupled to the clock phase shifter circuit to receive a respective one of the strobe signals, and a data output terminal operable to couple a signal stored in the latch to the logic circuit, the latches being operable to store the signal coupled to the data input terminals of the latches at a time determined by the respective strobe signal applied to each of the latches.

69. The computer system of claim 62 wherein the packetized DRAM is further adapted to receive a command packet applied to a command bus, the command packet and a flag signal applied to the flag input terminal of the DRAM having predetermined patterns during initialization of the DRAM, and wherein the system further includes a detection circuit for detecting an error in the command packet as received by the DRAM, the detection circuit comprising:

a command packet sampling circuit having a data input coupled to the command bus and a clock terminal coupled to the clock generator to receive the at least one strobe signal the command packet sampling circuit being operable to obtain samples at a rate that is sufficiently high that a plurality of samples are taken during the duration of the initialization flag signal; and a comparator circuit operable to compare the samples of the command bus to the samples of the flag signal applied to the flag input terminal of the DRAM.

70. The computer system of claim 69 wherein the command packet sampling circuit is operable to sample the command bus at the same rate that the flag sampling circuit samples the flag signal applied to the flag input terminal of the DRAM.

71. The computer system of claim 69 wherein the command packet sampling circuit is operable to sample the command bus at substantially the same times that the flag sampling circuit samples the flag signal applied to the flag input terminal of the DRAM.

* * * * *